(12) United States Patent
Shinohara

(10) Patent No.: US 10,847,487 B2
(45) Date of Patent: Nov. 24, 2020

(54) ANISOTROPIC ELECTRICALLY CONDUCTIVE FILM AND CONNECTION STRUCTURE

(71) Applicant: DEXERIALS CORPORATION, Tokyo (JP)

(72) Inventor: Seiichiro Shinohara, Kanuma (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 16/724,652

(22) Filed: Dec. 23, 2019

(65) Prior Publication Data

US 2020/0161268 A1 May 21, 2020

Related U.S. Application Data

(63) Continuation of application No. 15/576,759, filed as application No. PCT/JP2016/065802 on May 27, 2016, now Pat. No. 10,546,831.

(30) Foreign Application Priority Data

May 27, 2015 (JP) ................. 2015-120627
May 28, 2015 (JP) ................. 2015-108662

(51) Int. Cl.
*H01L 23/00* (2006.01)
*H05K 3/32* (2006.01)

(52) U.S. Cl.
CPC ............ *H01L 24/29* (2013.01); *H01L 24/27* (2013.01); *H05K 3/323* (2013.01); *H01L 24/32* (2013.01);

(Continued)

(58) Field of Classification Search
CPC . H01L 2224/29364; H01L 2224/29387; H01L 2224/2939; H01L 2224/29439;
(Continued)

(56) References Cited

U.S. PATENT DOCUMENTS 10,546,831 B2 * 1/2020 Shinohara ............... H01L 24/27

FOREIGN PATENT DOCUMENTS

| CN | 102668251 A | 9/2012 |
| CN | 104541417 A | 4/2015 |

(Continued)

OTHER PUBLICATIONS

Jul. 26, 2016 Written Opinion issued in International Patent Application No. PCT/JP2016/065802.
(Continued)

*Primary Examiner* — Seahvosh Nikmanesh
(74) *Attorney, Agent, or Firm* — Oliff PLC

(57) ABSTRACT

An anisotropic electrically conductive film includes electrically conductive particles disposed in an electrically insulating adhesive layer. The particles are arranged at a predetermined pitch along first axes, arranged side by side, and are substantially spherical. The particle pitch at the first axes and the axis pitch of the first axes are both greater than or equal to 1.5D, D being an average particle diameter of the particles. Directions of all sides of a triangle formed by a particle (P0), which is one of the electrically conductive particles at one of the first axes, an electrically conductive particle (P1), which is at the one of the first axes and adjacent to the particle (P0), and an electrically conductive particle (P2), which is at another one of the first axes that is adjacent to the one of the first axes, are oblique to a film width direction of the conductive film.

17 Claims, 18 Drawing Sheets

(52) U.S. Cl.
CPC ........ *H01L 24/83* (2013.01); *H01L 2224/271* (2013.01); *H01L 2224/2712* (2013.01); *H01L 2224/27464* (2013.01); *H01L 2224/2929* (2013.01); *H01L 2224/2939* (2013.01); *H01L 2224/29339* (2013.01); *H01L 2224/29344* (2013.01); *H01L 2224/29347* (2013.01); *H01L 2224/29355* (2013.01); *H01L 2224/29357* (2013.01); *H01L 2224/29364* (2013.01); *H01L 2224/29387* (2013.01); *H01L 2224/29439* (2013.01); *H01L 2224/29444* (2013.01); *H01L 2224/29447* (2013.01); *H01L 2224/29455* (2013.01); *H01L 2224/29457* (2013.01); *H01L 2224/29464* (2013.01); *H01L 2224/29499* (2013.01); *H01L 2224/32145* (2013.01); *H01L 2224/32225* (2013.01); *H01L 2224/81903* (2013.01); *H01L 2224/83851* (2013.01); *H01L 2224/9211* (2013.01); *H05K 2201/09945* (2013.01)

(58) Field of Classification Search
CPC . H01L 2224/29444; H01L 2224/29447; H01L 2224/29455; H01L 2224/29457; H01L 2224/29464
See application file for complete search history.

(56) References Cited

FOREIGN PATENT DOCUMENTS

| | | | |
|---|---|---|---|
| JP | H0574512 | A | 3/1993 |
| JP | H09-320345 | A | 12/1997 |
| JP | 2001-189171 | A | 7/2001 |
| JP | 2003208931 | A | 7/2003 |
| JP | 2005-327509 | A | 11/2005 |
| JP | 2011-068913 | A | 4/2011 |
| JP | 4887700 | B2 | 2/2012 |
| JP | 2012-248531 | A | 12/2012 |
| JP | 2013-018833 | A | 1/2013 |
| JP | 2013-077557 | A | 4/2013 |
| JP | 2013-149966 | A | 8/2013 |
| JP | 2014-044948 | A | 3/2014 |
| JP | 2014-60150 | A | 4/2014 |
| JP | 2015-008129 | A | 1/2015 |
| KR | 10-2012-0099424 | A | 9/2012 |
| KR | 10-2015-0048667 | A | 5/2015 |
| WO | 2014/034741 | A1 | 3/2014 |

OTHER PUBLICATIONS

May 27, 2016 International Preliminary Report on Patentability issued in International Patent Application No. PCT/JP2016/065802.
Aug. 28, 2017 International Search Report issued in International Patent Application No. PCT/JP2016/065802.
Nov. 15, 2018 Office Action issued in Korean Patent Application No. 10-2017-7032131.
Dec. 3, 2018 Office Action issued with Chinese Patent Application No. 201680027723.8.
May 30, 2019 Office Action issued in Korean Patent Application No. 10-2017-7032131.
May 28, 2019 Office Action issued in Chinese Patent Application No. 201680027723.8.
Dec. 13, 2019 Office Action issued in Taiwanese Patent Application No. 105116843.
Mar. 3, 2020 Office Action issued in Japanese Patent Application No. 2016-106500.

* cited by examiner

US 10,847,487 B2

ANISOTROPIC ELECTRICALLY CONDUCTIVE FILM AND CONNECTION STRUCTURE

This application is a continuation of U.S. patent application Ser. No. 15/576,759, filed Nov. 24, 2017, which is a National Stage Entry of PCT/JP2016/065802, filed May 27, 2016, which claims priority from Japanese Patent Application No. 2015-108662, filed May 28, 2015, and Japanese Patent Application No. 2015-120627, filed May 27, 2015. The entire contents of all of the above-mentioned documents are hereby incorporated by reference.

TECHNICAL FIELD

The present invention relates to an anisotropic electrically conductive film and a connection structure connected via the anisotropic electrically conductive film.

BACKGROUND ART

Anisotropic electrically conductive films are widely used when mounting electronic components such as IC chips on substrates. In recent years, demand has risen for increasingly high wiring density in small electronic devices such as mobile phones and notebook-size personal computers. One well-known technology for achieving this high wiring density involves utilizing an anisotropic electrically conductive film in which electrically conductive particles are uniformly disposed in a lattice form in an electrically insulating adhesive layer of the anisotropic electrically conductive film.

However, there is a problem in that variations in connection resistance occur even though the electrically conductive particles are evenly disposed. This is because, when the electrically insulating adhesive is melted, electrically conductive particles located above the edges of the terminals may flow to spaces between terminals and thus are less likely to be held between upper and lower terminals. One proposed technique for solving this problem involves setting a first arrangement direction of the electrically conductive particles as the longitudinal direction of the anisotropic electrically conductive film and setting a second arrangement direction that intersects with the first arrangement direction to be inclined at an angle of from 5° to 15° relative to a direction orthogonal to the longitudinal direction of the anisotropic electrically conductive film (Patent Document 1).

CITATION LIST

Patent Literature

Patent Document 1: JP No. 4887700 B

SUMMARY OF INVENTION

Technical Problem

However, as the terminal size of electronic components connected via the anisotropic electrically conductive film becomes increasingly small, the number of electrically conductive particles that can be captured on each terminal similarly becomes increasingly small. With the anisotropic electrically conductive film disclosed in Patent Document 1, sufficient conduction reliability sometimes may not be achieved. In so-called Chip-on-Glass (COG) connection technologies that are used to connect controller ICs for liquid crystal screens and the like to transparent electrodes formed on glass substrates, terminal size can be particularly small due to the large numbers of terminals associated with increased high liquid crystal screen resolutions as well as miniaturization of the IC chips. Similarly, connection terminals also tend to have a relatively fine pitch when using Film-on-Glass (FOG) connection technologies to connect Flexible Printed Circuits (FPC) to glass substrates for television displays, which makes it difficult to increase the number of electrically conductive particles that can be captured on each connection terminal in order to increase the conduction reliability.

One conceivable method of increasing the number of electrically conductive particles that can be captured on each connection terminal would be to further increase the density of the electrically conductive particles in the anisotropic electrically conductive film. However, increasing the density of the electrically conductive particles in the anisotropic electrically conductive film poses a problem in that the production costs of the anisotropic electrically conductive film increase.

The present invention therefore aims to provide an anisotropic electrically conductive film that achieves consistent conduction reliability even in fine-pitch FOG connections and COG connections while suppressing increases in production costs associated with increasing the density of the electrically conductive particles.

Solution to Problem

The present inventor has found the following and conceived the present invention. In an anisotropic electrically conductive film, arrangements of electrically conductive particles in which electrically conductive particles are arranged at a predetermined pitch along axes and the axes are arranged side by side at a predetermined axis pitch may be provided in the following manner. Directions of all sides of a triangle formed by three adjacent electrically conductive particles may be oblique to the film width direction of the anisotropic electrically conductive film. With this configuration, even if a misalignment occurs in the alignment between facing terminals that are to be anisotropically electrically conductively connected to each other and therefore the effective mounting area is reduced, sufficient capturing of the electrically conductive particles on the terminals will be achieved to improve the conduction reliability. In addition, use of substantially spherical particles as the electrical conductivity particles will facilitate production of an anisotropic electrically conductive film in which electrically conductive particles are precisely disposed in desired lattice form arrangements and will also enable, by indentations formed by the electrically conductive particles on the terminals, accurate checking of the connection status after anisotropically electrically conductive connection. By varying the pitch of the electrically conductive particles along the lattice axes and the pitch of the lattice axes in accordance with the width sizes of the terminals that are to be anisotropically electrically conductively connected to each other, the density of the electrically conductive particles necessary to ensure conduction reliability can be reduced.

The present invention provides an anisotropic electrically conductive film. The anisotropic electrically conductive film includes an electrically insulating adhesive layer and electrically conductive particles disposed in the electrically insulating adhesive layer. The electrically conductive particles are arranged such that first axes, along which the electrically conductive particles are arranged at a predetermined particle pitch, are arranged side by side at a predetermined axis pitch. The electrically conductive particles are substantially spherical. An electrically conductive particle pitch L1 at the first axes is greater than or equal to 1.5D and an axis pitch L3 of the first axes is greater than or equal to 1.5D where D is an average particle diameter of the electrically conductive particles. Directions of all sides of a triangle formed by an electrically conductive particle P0, an electrically conductive particle P1, and an electrically conductive particle P2 are oblique to a film width direction of the anisotropic electrically conductive film. The electrically conductive particle P0 is any one of the electrically conductive particles at any one of the first axes. The electrically conductive particle P1 is at the one of the first axes and adjacent to the electrically conductive particle P0. The electrically conductive particle P2 is at another one of the first axes that is adjacent to the one of the first axes. The electrically conductive particle P2 is spaced from the electrically conductive particle P0 by a minimum spacing.

Furthermore, the present invention also provides a connection structure including the above-mentioned anisotropic electrically conductive film, a first electronic component, and a second electronic component, an anisotropically electrically conductive connection being formed between the first electronic component and the second electronic component using the anisotropic electrically conductive film.

Advantageous Effects of Invention

In anisotropic electrically conductive films of the present invention, arrangements of electrically conductive particles in a regular pattern are formed in an electrically insulating adhesive layer in such a manner that the directions of all sides of a triangle formed by three adjacent electrically conductive particles are oblique to the film width of the anisotropic electrically conductive film. As a result, even if a misalignment occurs in the alignment between facing terminals that are to be anisotropically electrically conductively connected to each other and thus the effective mounting area is reduced, sufficient capturing of the electrically conductive particles on each terminal is achieved. Also, when bonding the anisotropic electrically conductive film to a terminal, even if a misalignment occurs in any direction, sufficient capturing of the electrically conductive particles on each terminal is achieved. Furthermore, when each of the terminals that are to be anisotropically electrically conductively connected to each other has a rectangular shape and the terminals are arranged side by side at a certain spacing in a certain direction, variations in the number of electrically conductive particles present within the rectangle are reduced. As a result, the number of electrically conductive particles captured by the terminals becomes stable.

In addition, an axis pitch L3 of the first axes may be adjusted so as to correspond to the length of the terminal pitch. The axis pitch L3 of the first axes and the electrically conductive particle pitch L1 on the first axes may be adjusted so that a necessary spacing can be ensured for the minimum interparticle spacing L2 between adjacent first axes. As a result, adjustment of the number density of the electrically conductive particles to a number density necessary to ensure the conduction reliability is achieved without excessively increasing the number density.

Furthermore, the electrically conductive particles are substantially spherical. As a result, the electrically conductive particles are precisely disposed in lattice form arrangements as described above. When the particle diameters are approximately equal, checking of the connection status after anisotropically electrically conductive connection can be accurately made by the states of indentations or compression formed by the electrically conductive particles on the terminals. This prevents an excessive local pressing force from being applied to, for example, IC chips to be connected.

Thus, with an anisotropic electrically conductive film of the present invention, connection structures including the anisotropic electrically conductive film have improved conduction reliability, and increases in production costs of anisotropic electrically conductive films associated with increase of the density of the electrically conductive particles are suppressed.

DESCRIPTION OF EMBODIMENTS

Figure 1:
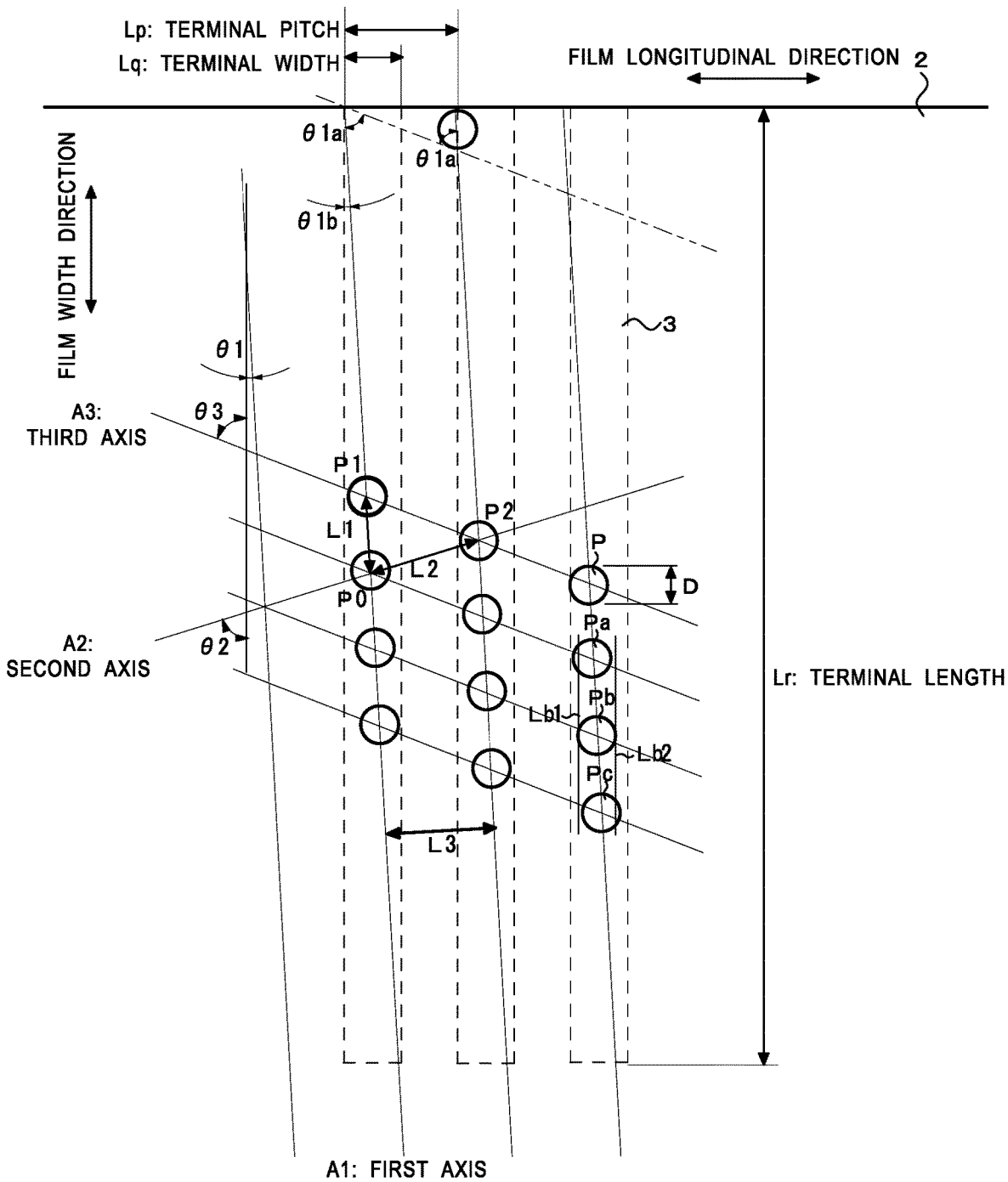
FIG. 1 is a diagram illustrating disposition of electrically conductive particles in an anisotropic electrically conductive film 1 of an example.

Next, the present invention will be described in detail with reference to the attached drawings. Note that in the drawings, the same reference characters are used to indicate components that are the same or similar.

FIG. 1 is a diagram illustrating disposition of electrically conductive particles P in an anisotropic electrically conductive film 1 of an example of the present invention. The anisotropic electrically conductive film 1 includes an electrically insulating adhesive layer 2 and the electrically conductive particles P fixed in lattice form arrangements in the electrically insulating adhesive layer 2. In the present invention, the film length is typically greater than or equal to 5000 times the film width. In FIG. 1, the broken lines indicate an array of terminals 3, which are to be connected via the anisotropic electrically conductive film 1.

For practical purposes, the film length is preferably greater than or equal to 5 m, more preferably greater than or equal to 10 m, and still more preferably greater than or equal to 30 m. The upper limit is not particularly specified but the film length is preferably less than or equal to 5000 m, more preferably less than or equal to 1000 m, and still more preferably less than or equal to 500 m. This is intended to suppress the cost of anisotropically electrically conductive connection by avoiding the need for excessive modification of existing connection apparatuses. The film width is not particularly limited to a specific film width, but preferably greater than or equal to 0.3 mm in order to conform not only to the terminal array areas of common electronic components but also to narrow-framed terminal array areas. From the standpoint of production of anisotropic electrically conductive films, the film width is more preferably greater than or equal to 0.5 mm, and from the standpoint of production stability, the film width is still more preferably greater than or equal to 0.6 mm. The upper limit is not particularly specified, but typically is less than or equal to 5 mm. When used for, for example, IC stacking, the film width may be approximately 30 cm because sometimes a width greater than the width of a wafer is required.

The anisotropic electrically conductive film may be formed by joining films together by a joint tape so as to have a long length as described above, and may be a rolled film wound around a core.

Sphericity and Particle Diameter of Electrically Conductive Particles

One principal feature of the present invention is that the electrically conductive particles P are substantially spherical. Herein, being substantially spherical means the sphericity as calculated using the following equation ranges from 70 to 100:

$$\text{Sphericity} = \{1 - (So - Si)/So\} \times 100$$

where $So$ is the area of the circumscribed circle of an electrically conductive particle in a plane image of the electrically conductive particle and $Si$ is the area of the inscribed circle of the electrically conductive particle in the plane image of the electrically conductive particle.

This calculation method is preferably performed in the following manner. Plane images of the electrically conductive particles within a surface field of view of the anisotropic electrically conductive film and in a cross section thereof are taken. In each of the plane images, 100 or more (preferably 200 or more) of the electrically conductive particles are randomly selected and the areas of the circumscribed circles and the inscribed circles of the particles are measured. The averages of the areas of the circumscribed circles and the averages of the areas of the inscribed circles are determined to be designated as $So$ and $Si$ described above. For both the surface field of view and the cross section, it is preferable that the sphericity be within the range described above. The difference in sphericity between the surface field of view and the cross section is preferably not greater than 20, and more preferably not greater than 10. The inspection of anisotropic electrically conductive films in the production process is performed using mainly the surface field of view, whereas the detailed pass/fail determination after anisotropically electrically conductive connection is performed using both the surface field of view and the cross section. Thus, it is preferable that the difference in sphericity be as small as possible.

The electrically conductive particles P are configured to have such sphericities as described above. As a result, when an anisotropic electrically conductive film in which arrangements of electrically conductive particles are formed by using, for example, a transfer mold as disclosed in JP 2014-60150 A is produced, the electrically conductive particles can roll smoothly on the transfer mold. Consequently, the electrically conductive particles are loaded to predetermined positions on the transfer mold with high precision. Thus, the electrically conductive particles are disposed precisely in arrangements having predetermined lattice axes. On the other hand, if the electrically conductive particles are cylindrical, the electrically conductive particles will not roll in all directions evenly, and therefore cannot be loaded onto the transfer mold with high precision. Furthermore, if the electrically conductive particles are spherical but somewhat flat, the diameter of the concavities of the transfer mold into which the electrically conductive particles are to be loaded needs to be significantly enlarged to the particle diameter of the electrically conductive particles. Thus, precise control of the disposition of the electrically conductive particles is difficult.

The electrically conductive particles P are configured to have such sphericities as described above and also to have reduced particle diameter variations. As a result, for connection structures formed by connecting a terminal of a first electronic component to a terminal of a second electronic component using the anisotropic electrically conductive film, accurate evaluations of the connection status can be made by indentations formed by the electrically conductive particles in the terminals. In particular, when the variations in the particle diameter of the electrically conductive particles are reduced to a CV value (standard deviation/average) of less than or equal to 20%, the evaluations of the connection status by indentations can be made accurately. Furthermore, at the time of anisotropically electrically conductive connection, electrically conductive particles located between the terminals are pressurized evenly as a whole, and thus a local concentration of the pressing force is prevented.

On the other hand, an excessively uniform particle diameter may be overengineered depending on the size of the terminals, and thus can be a factor that increases the production costs of the anisotropic electrically conductive film. In contrast, when the CV value is within 20%, the checking of the connection status by indentations can be made accurately both for large terminals (e.g., for FOG) and small terminals (e.g., for COG).

Figure 2A:
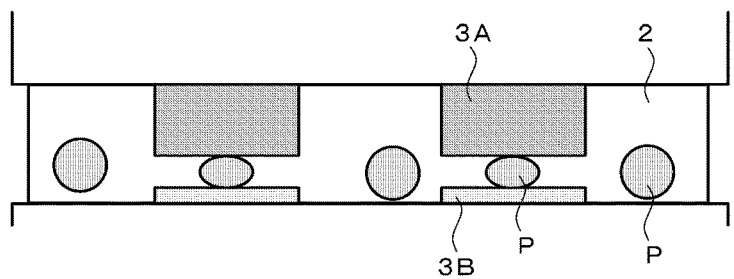
FIG. 2A is a diagram illustrating a connection status when connection has been made using substantially spherical electrically conductive particles.
Figure 2B:
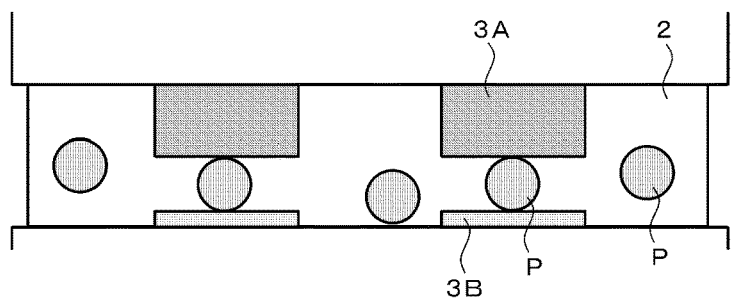
FIG. 2B is a diagram illustrating a connection status when connection has been made using substantially spherical electrically conductive particles.

Accurate evaluations of the connection status by indentations formed by electrically conductive particles are desired for any anisotropically electrically conductive connection, but in particular, it is preferred for COG, which employs a fine pitch. Specifically, in the case where, prior to connection, the sphericity of the electrically conductive particles is high and the particle diameter is substantially uniform, it is seen from FIG. 2A that, when the electrically conductive particles P between facing terminals 3A and 3B are of a flat circular shape as viewed in cross section after connection, the facing terminals 3A and 3B are sufficiently bonded to each other via the electrically conductive particles P so that reliable conduction will be provided. However, it is seen from FIG. 2B that, when the electrically conductive particles P are not crushed because of insufficient pushing at the time of connection, the bonding is insufficient and this will result in poor conduction. In such a case, a pass/fail of an anisotropically electrically conductive connection, in the case of COG, can be determined by observing indentations from the glass side (from the transparent substrate side). That is, when the electrically conductive particles P are crushed as in FIG. 2A, a sufficient indentation will be formed, but when the pushing for bonding is insufficient as in FIG. 2B, it is unlikely that a sufficient indentation will be formed. Thus, when the electrically conductive particles are substantially spherical, it is likely that the shape of the indentations will be uniform, and as a result, determination of a pass/fail of the bonding by indentations will be facilitated. This is particularly true of the present invention, in which the electrically conductive particles are disposed, each being independent and spaced apart from each other. For this reason as well, it is desirable that the electrically conductive particles be substantially spherical.

Variations in the particle diameter can be calculated using an image-type particle size analyzer, for example. For raw material particles of the electrically conductive particles for the anisotropic electrically conductive film, i.e., particles before being disposed in the anisotropic electrically conductive film, the particle diameter can be determined, for example, using a wet-type flow particle size and shape analyzer FPIA-3000 manufactured by Malvern Instruments Ltd. For electrically conductive particles disposed in the anisotropic electrically conductive film, the particle diameter can be determined by plane images or cross-sectional images as with the sphericity described above.

Evaluations of the connection status by the manner in which the electrically conductive particles P are crushed can be made particularly favorably when the electrically conductive particles P are metal-coated resin particles including a resin core and an electrically conductive layer thereon.

With regard to the evaluations of the connection status by the manner in which the electrically conductive particles P are crushed, particularly in the case where a plurality of terminals are arrayed, the manner can be compared between the terminals and therefore the evaluation of the connection status for each terminal is facilitated. By facilitating the ascertaining of the connection statuses of adjacent terminals, productivity in the anisotropically electrically conductive connection process will be improved. This tendency becomes more evident when the electrically conductive particles are substantially spherical, which is therefore preferable.

Figure 2C:
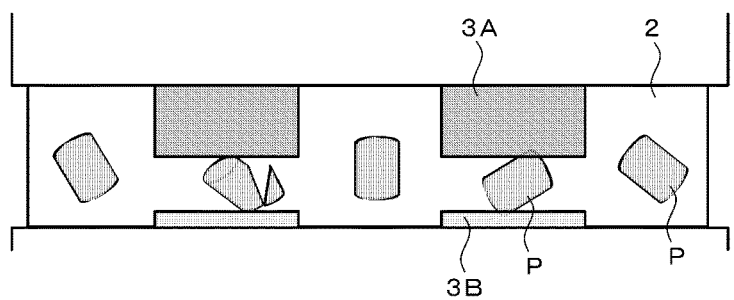
FIG. 2C is a diagram illustrating a connection status when connection has been made using cylindrical electrically conductive particles.
Figure 2D:
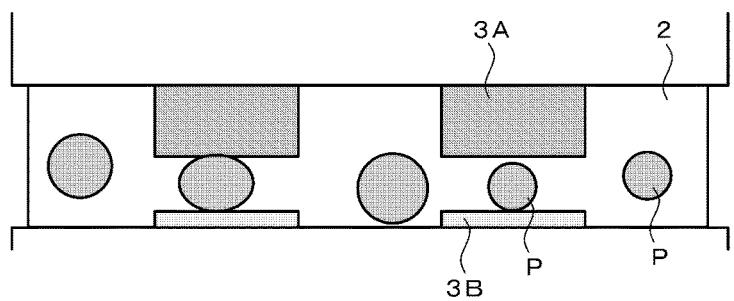
FIG. 2D is a diagram illustrating a connection status when connection has been made using electrically conductive particles having various particle diameters.

On the other hand, when the electrically conductive particles are not substantially spherical, the manner in which the electrically conductive particles are crushed varies depending on orientations in which the electrically conductive particles contact a terminal and thus the manner in which the indentation appears varies. As a result, accurate evaluations of the connection status by indentations cannot be made. Furthermore, when the electrically conductive particles P are cylindrical, the particles can be easily broken as illustrated in FIG. 2C, and a local concentration of a pressing force can occur to cause some particles to be crushed. As a result, the connection status cannot be determined by the degree of deformation. Also, when there are excessive variations in the particle diameter as illustrated in FIG. 2D, the connection status cannot be determined by the degree of deformation. Furthermore, when there are large variations in the particle diameter, some particles may not be held sufficiently between facing terminals. This is not preferred also from the standpoint of stabilization of conduction reliability.

The electrically conductive particles having a sphericity ranging from 70 to 100 may preferably be particles including a resin core and an electrically conductive layer thereon in terms of availability. The resin core may be produced by a known method, such as suspension polymerization, emulsion polymerization, and seed polymerization, to obtain a certain level of sphericity. Further operations, such as classification by screening and disintegration, may be appropriately performed on the resultant, so that a resin core having a sphericity at a certain level or higher can be obtained.

The resin core may preferably be a particle made of a plastics material, which has high compressive deformability. Examples of the material include (meth)acrylate resins, polystyrene resins, styrene-(meth)acrylate copolymer resins, urethane resins, epoxy resins, phenolic resins, acrylonitrile-styrene (AS) resins, benzoguanamine resins, divinylbenzene resins, styrene resins, and polyester resins.

For example, when the resin core is formed from a (meth)acrylate resin, it is preferable that the (meth)acrylilate resin be a copolymer of a (meth)acrylic acid ester and, as necessary, a compound having reactive double bonds and copolymerizable therewith, and bifunctional or polyfunctional monomer.

Preferably, the resin core has a hardness that allows the resin core to be compressed to approximately from 70 to 80% after anisotropically electrically conductive connection. Thus, the compressive deformability of the resin core is selected from a wide variety on the basis of the combination of electronic components that are to be connected to each other. Typically, relatively soft particles having a compression hardness (K value) at 20% deformation ranging from 1500 to 4000 N/mm$^2$ are preferred. In the case of anisotropically electrically conductively connecting an FPC to an FPC (FOF), relatively soft particles having a compression hardness (K value) at 20% deformation ranging from 1500 to 4000 N/mm$^2$ are also preferred. In the case of anisotropically electrically conductively connecting an IC chip to a glass substrate, relatively hard particles having a compression hardness (K value) at 20% deformation ranging from 3000 to 8000 N/mm$^2$ are preferred. Regardless of the material, in the case of an electronic component having a wire surface on which an oxide film is formed, harder particles having a compression hardness (K value) at 20% deformation of greater than or equal to 8000 N/mm$^2$ may be preferred. The upper limit of the hardness need not be particularly specified because the material is a resin and has a limit.

Herein, the compression hardness (K value) at 20% deformation refers to a value calculated by the following equation. In the equation, the load is a load applied to an electrically conductive particle in a direction in which the particle is compressed so that the particle diameter of the electrically conductive particle is decreased from its original particle diameter by 20%. The smaller the K value, the softer the particle.

$$K=(3/\sqrt{2})F \cdot S^{-8/2} \cdot R^{-1/2}$$

where F: a load at 20% deformation of an electrically conductive particle;

S: a compression displacement (mm); and

R: a radius (mm) of the electrically conductive particle.

With the above-described method for producing resin cores, aggregates (secondary particles) of resin cores may be produced in some cases. In such a case, disintegration of the aggregated resin cores is performed. The disintegration is preferably performed so as to disintegrate the aggregates of resin cores, which have been aggregated during drying of the solvent, without deforming the shapes of the particles. This operation can be carried out by using an air flow jet mill. Examples of the jet mill include A-O JET MILL, which is a micro-lab jet mill, and CO-JET SYSTEM (both manufactured by Seishin Enterprise Co., Ltd.). A cyclone recovery mechanism may be used in combination.

Resin cores having a relatively low sphericity within the sphericity ranging from 70 to 100 can be obtained as follows. Aggregates of resin particles having a broad particle diameter distribution are produced, and the operation of classification and disintegration is appropriately adjusted. In this manner, aggregates of a plurality of resin particles can be obtained to be used as the resin cores. The height of the projections may range from 10 to 500 nm or may be less than or equal to 10% of the particle diameter, for example.

The electrically conductive particles may have projections on the surface. For example, electrically conductive particles disclosed in JP 2015-8129 A, for example, may be used. With such projections formed, the protective film provided on a terminal can be broken at the time of anisotropically electrically conductive connection. The projections are preferably formed so as to be disposed uniformly on the surface of the electrically conductive particles. However, some of the projections may become lost in the step of loading the electrically conductive particles onto a mold for forming arrangements of the electrically conductive particles, among the production steps for the anisotropic electrically conductive film.

The electrically conductive particles P may be metal-coated resin particles as described above or may be metal particles including nickel, cobalt, silver, copper, gold, palladium, or a solder, for example. Use of two or more of these materials is possible. The electrically conductive particles that are used to produce anisotropic electrically conductive films may form secondary particles.

In the present invention, a particle diameter D of the electrically conductive particles P is an average particle diameter. From the perspective of preventing short-circuits and ensuring the stability of the bonding between connected terminals, the particle diameter D of the electrically conductive particles P preferably ranges from 1 to 30 μm, and more preferably ranges from 2.5 to 15 μm. In anisotropically electrically conductive connection, there are cases in which the terminals between which electrically conductive particles are to be held have a protective film or have a terminal surface that is not flat. However, even in such cases, by selecting a preferable electrically conductive particle diameter of greater than or equal to 2.5 μm or a more preferable diameter of greater than or equal to 3 μm, the holding of the electrically conductive particles by the terminals can be made stable.

Number Density of Electrically Conductive Particles

In the present invention, by varying the arrangements of the electrically conductive particles P in accordance with the width or pitch of the connection target terminals, the number density of the electrically conductive particles P is adjusted to be within an appropriate range for ensuring the conduction reliability. Typically, in both FOG connection and COG connection, when at least three or preferably at least ten electrically conductive particles are captured on a pair of facing terminals, good conduction characteristics are obtained.

For example, in the case of FOG connection, the width of the connection target terminals is 30 times or more the electrically conductive particle diameter. Thus, the overlapping area of facing terminals (effective connection area) is sufficiently large, and therefore the number density of the electrically conductive particles may range from 7 to 25 per $mm^2$ to enable connection. More specifically, when, in the connection portion, the width of the terminal is 0.2 mm, the length of the terminal is greater than or equal to 2 mm, the space between adjacent terminals is 0.2 mm (L/S=1), the film width of the anisotropic electrically conductive film is 2 mm, and the connection is made at the film width, the density of the electrically conductive particles can be reduced to about from 7 to 8 per $mm^2$. In this case, it is not necessary that the entirety of the film width be connected, and a tool having a length less than or equal to the film width may be used to apply pressure. The pressurized portion constitutes the effective connection area, and thus the connection length of the terminals is less than or equal to 2 mm.

Furthermore, in the case where the connection target terminals have a long length as with the above case but has a narrow width (e.g., an FPC having a terminal width ranging from 10 to 40 μm), when rapid operation is required to increase the productivity of the anisotropically electrically conductive connection process, including the alignment process that precedes the connection, it is preferable that the number density of the electrically conductive particles range from 38 to 500 per $mm^2$ so that a decrease in the effective connection area due to a misalignment in the alignment between facing terminals can be tolerated. If the effective terminal width is narrowed to approximately 10 μm as a result of a misalignment in the alignment, it is more preferable that the number density range from 150 to 500 per $mm^2$.

On the other hand, in the case of, for example, FOG connection for a touch panel, for example, the terminal length may be short for narrowing the frame. Thus, for example, connection of an FPC having a terminal width ranging from 20 to 40 μm and a terminal length of less than or equal to 0.7 mm, desirably of less than or equal to 0.5 mm, is required. In such a case, the number density of the electrically conductive particles is, preferably, from 108 to 2000 per $mm^2$, and more preferably, from 500 to 2000 per $mm^2$.

The above can be summarized as follows. In the present invention, while the lower limit of the number density of the electrically conductive particles depends on the terminal width, the terminal length, or the connection length (tool width), the number density is preferably greater than or equal to 7 per mm$^2$, more preferably greater than or equal to 38 per mm$^2$, and still more preferably greater than or equal to 108 per mm$^2$. When the number density is greater than or equal to 500 per mm$^2$, connection can be made even if the effective connection area is small to some degree.

The number density of the electrically conductive particles may be set to be as small as possible for each different connection target. However, if the types of products to be produced are increased, the method is unsuitable for mass production. For this reason, it is possible to substitute an anisotropic electrically conductive film having the above-described maximum lower limit of greater than or equal to 500 per mm$^2$ for films of the types having a lower limit lower than the maximum lower limit. The lower limit may be increased by 20% to 600 per mm$^2$ with the production margin of mass production taken into account. This is because reducing the product types may be more likely to produce effects than does reducing the number of the electrically conductive particles, which will be described later. In particular, when the number density is less than or equal to 3000 per mm$^2$, preferably less than or equal to 2500 per mm$^2$, or more preferably less than or equal to 2000 per mm$^2$, it can be assumed that, in the case of a terminal layout having an effective connection area of greater than or equal to 5000 μm$^2$ per terminal, the spacing between adjacent terminals is sufficient. For example, the spacing is greater than or equal to 20 μm, preferably greater than or equal to 30 μm, or more preferably greater than 30 μm when the electrically conductive particle diameter is less than or equal to 5 μm, or the spacing is a spacing greater than or equal to four times the electrically conductive particle diameter, preferably greater than or equal to six times the diameter, and more preferably greater than six times the diameter. In this case, since, in the present invention, the electrically conductive particles are each independently disposed and therefore short-circuits are avoided as much as possible, the effect of reducing the total cost is more prominent. In the present invention, a fine pitch and a normal pitch are distinguished by specifying the boundary between them to be 30 μm for convenience as described later. Because of recent diversification of portable display devices, electronic components are also being diversified. In the present invention, as described above, the number density of the electrically conductive particles may be set so that the anisotropic electrically conductive films are used for many product types. Thus, the present invention provides an improvement over various types of existing anisotropic electrically conductive films.

In anisotropically electrically conductive connection of either FOG connection or COG connection, it is preferable that the film width direction of the anisotropic electrically conductive film 1 be oriented in the same direction as the longitudinal direction of the terminal 3. This is intended to facilitate sequential operation of the step of bonding the film to an electronic component prior to connection and to ensure that the electrically conductive particles are held between facing terminals stably. In either FOG connection or COG connection, when the number density of the electrically conductive particles is excessively increased, the production cost for the anisotropic electrically conductive film will increase, and in anisotropically electrically conductive connection, the pressing force will increase. When the number of terminals is increased due to a fine pitch configuration and the number of electrically conductive particles to be captured by each terminal is excessively increased, the pressing force of existing connection pressure apparatuses that are used for anisotropically electrically conductive connection will be insufficient. If this is addressed by modifying the apparatus, there is a concern that the costs will increase.

In view of this, for both FOG connection and COG connection, to inhibit the application of excessive force, the number of electrically conductive particles to be captured by a pair of facing terminals is set to be preferably less than or equal to 50, more preferably less than or equal to 40, and even more preferably less than or equal to 20.

In COG connection, there can be various terminal sizes, but an assumption is made that the terminal width is 10 μm and the terminal length is 50 μm, for example. In this case, to inhibit the application of excessive pressing force, the number density of the electrically conductive particles is preferably less than or equal to 100000 per mm$^2$, and more preferably less than or equal to 80000 per mm$^2$.

Based on the above, the number of the electrically conductive particles to be captured by a pair of facing terminals preferably ranges from 3 to 50, and more preferably ranges from 10 to 40 regardless of the size or area of the terminals. To achieve such a number of captured electrically conductive particles, the number density of the electrically conductive particles may be set as follows. In FOG connection, when, for example, the terminal width ranges from 20 to 40 μm and the terminal length ranges from 500 to 2000 μm, the number density preferably ranges from 40 to 3000 per mm$^2$, and particularly preferably ranges from 50 to 2500 per mm$^2$. The length of the area connected (i.e., tool width) may be regarded as the terminal length described above. In COG connection, when, for example, the terminal width ranges from 5 to 50 μm and the terminal length ranges from 30 to 300 μm, the number density preferably ranges from 4000 to 100000 per mm$^2$, and particularly preferably ranges from 5000 to 80000 per mm$^2$. By setting the number density of the electrically conductive particles to fall within these ranges, preparation of minimally required electrically conductive particle disposition patterns in accordance with the terminal width or the terminal length is made possible. Note that FOG and COG are mentioned for illustrative purposes to describe common anisotropically electrically conductive connections and that the electronic components are not necessarily limited to FPC, IC chips, or glass substrates and may be any components similar to any of these.

Arrangements of Electrically Conductive Particles

In the present invention, the arrangements of the electrically conductive particles P are as follows. The electrically conductive particles P are arranged at a predetermined electrically conductive particle pitch L1 along first axes A1. The first axes A1 are arranged side by side at a predetermined axis pitch L3. In the anisotropic electrically conductive film 1 illustrated in FIG. 1, the arrangements are in lattice form in such a manner that the electrically conductive particle pitch L1 of the first axes A1, the axis pitch L3, and a minimum interparticle spacing L2 between adjacent ones of the first axes A1 have a specific dimension with respect to the electrically conductive particle diameter D as described below. Furthermore, the lattice axes A1, A2 and A3 in the three main directions that form the lattice form arrangements of the electrically conductive particles P are oblique to the film width direction of the anisotropic electrically conductive film.

This oblique configuration is expected to produce the effect of stabilizing the number of the electrically conductive particles P to be captured by the terminals 3. If the lattice axes (also referred to as arrangement axes) of the electrically conductive particles P are parallel to the perimeter of rectangular terminals 3, i.e., parallel to the longitudinal direction or the short-side direction of the film, an extreme phenomenon in which all the particles are captured or none of the particles are captured can occur when a arrangement of the electrically conductive particles P exists at an end of the terminal 3. One way to avoid the phenomenon may be to carry out positioning when performing bonding of the film. However, this will require, for example, identification of the positions of the terminals and the electrically conductive particles in the films on a constant basis, and consequently the production costs for connection structures will increase. To avoid this, it is important that an extreme difference in the number of particles captured by the terminals not be generated in any region in the film. For this reason, it is desirable that the arrangement axes A1, A2, and A3 of the electrically conductive particles P be oblique to the film width direction (longitudinal direction of a rectangular terminal in typical anisotropically electrically conductive connection).

Electrically Conductive Particle Pitch L1

The electrically conductive particle pitch L1 at the first axes A1 is greater than or equal to 1.5D where D is the average particle diameter of the electrically conductive particles P. This is intended to prevent short-circuits between juxtaposed terminals in the same component and to ensure stability of the bonding between facing terminals of first and second electronic components, when terminals of the first electronic component and terminals of the second component are anisotropically electrically conductively connected to each other using the anisotropic electrically conductive film 1.

The electrically conductive particles P along the first axes A1 may not be strictly linearly aligned and may be offset within a range of a band-shaped line of a width sufficiently small relative to the axis pitch L3. The band width for offsetting is preferably less than 0.5 times the electrically conductive particle diameter D in terms of the distance between centers of adjacent electrically conductive particles. This produces the effect of stabilizing the number of electrically conductive particles captured at the terminal ends.

As described above, it is preferable that the film width direction of the anisotropic electrically conductive film 1 be oriented in the same direction as the longitudinal direction of the terminal 3. Thus, in the case of FOG connection, it can be assumed that the length of the electrically conductive particle pitch L1 in the direction of the first axes A1 in the anisotropic electrically conductive film 1 is, at maximum, approximately equal to a length Lr of the terminal 3 in the longitudinal direction (hereinafter referred to as terminal length). Typically, the terminal length Lr is less than or equal to 2000 μm. When three electrically conductive particles are to be disposed along the length Lr of 2000 μm, the electrically conductive particle pitch L1 is preferably less than 1000D, and particularly preferably less than or equal to 221D from the standpoint of stable conduction performance.

On the other hand, in the case of COG connection, the terminal length Lr is typically less than or equal to 200 μm, and a terminal width Lq is assumed to be, at minimum, 3 μm with a misalignment in the alignment between facing terminals taken into account. In this case as well, the length of the first axes A1 on the terminal 3 can be assumed to be, at maximum, approximately equal to the terminal length Lr and thus is less than or equal to 200 μm. When three or more electrically conductive particles are to be present there, the electrically conductive particle pitch L1 is preferably less than 100D, particularly preferably less than or equal to 22D from the standpoint of stable conduction performance, and more preferably less than or equal to 10D from the standpoint of identifiability of the first axes A1.

Among the arrangement axes of the electrically conductive particles, the first axes A1 may be defined as arrangement axes having the smallest particle pitch, so that, in the embodiments of arrangements illustrated in FIGS. 12 and 13, which will be described later, the features of the particle arrangements can be defined in an easy-to-understand manner to be designed.

Figure 3A:
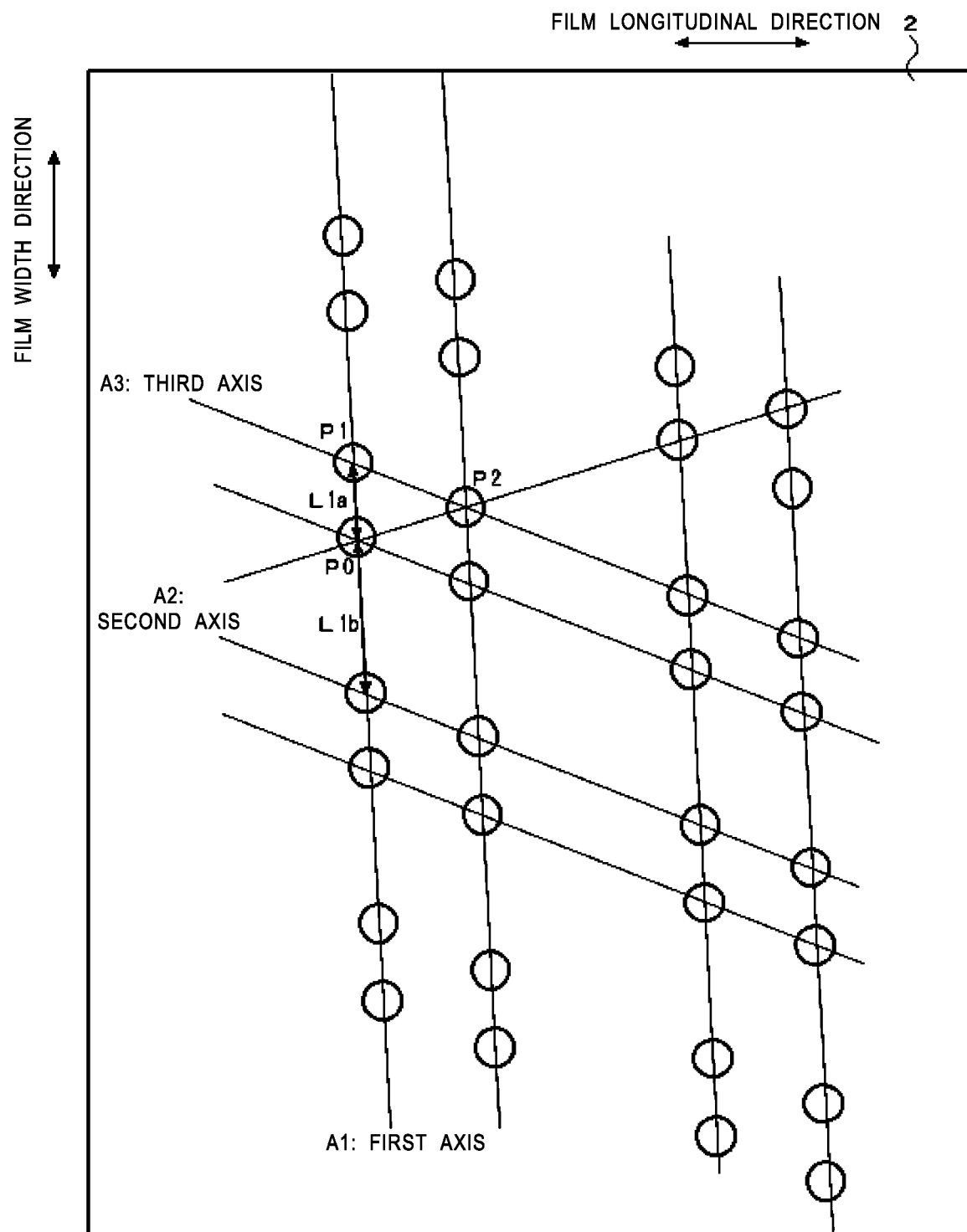
FIG. 3A is a diagram illustrating a modified example of disposition of electrically conductive particles in an anisotropic electrically conductive film.

In a fine pitch configuration, the electrically conductive particle pitch L1 of the first axes A1 may not be strictly the same at every location. In such a case, for example, it is preferable that the pitch for the first axes be such that wide and narrow pitches L1a and L1b repeat in a regular manner as illustrated in FIG. 3A. This is because wide and narrow pitches that occur in a regular manner along each lattice axis make it possible to relatively increase the number density of the electrically conductive particles at regions where a terminal exists and relatively decrease the number density of the electrically conductive particles at regions where a terminal does not exist (e.g., spaces between bumps). With this configuration, the number of particles captured by the terminals will be increased and the risk of short-circuits can be avoided more easily. The same applies to the electrically conductive particle pitches at the second axes A2 and the third axes A3. In other words, at least one lattice axis may have an axis pitch including wide and narrow pitches that occur in a regular manner.

Axis Pitch L3

The axis pitch L3 of the first axes A1 is more preferably greater than 2D with the offset range of 0.5D of the electrically conductive particles for each first axis A1 taken into account. In the case of COG connection, to stabilize the number of captured electrically conductive particles, it is desirable that each of the terminals intersect three or more arrangement lines of the first axes A1.

The upper limit of the axis pitch L3 may be appropriately selected on the basis of, for example, the electrically conductive particle pitch L1 or the connection targets. In the case of FOG connection, the terminal length is sufficiently large relative to the electrically conductive particle diameter, and therefore capturing of a sufficient number of electrically conductive particles to achieve conduction can be accomplished by part of the arrangement line of each first axis A1. Thus, the axis pitch L3 only need be smaller than the terminal width, and it is preferably less than 200D, and more preferably less than 80D.

On the other hand, when IC chips may be stacked via, for example, through-silicon vias (TSVs), the terminals correspond to solder joints of approximately φ30 μm at minimum, and in order for the terminals to be intersected by three or more arrangement lines of the first axes A1, the axis pitch L3 is preferably less than 10D, and more preferably less than 4D.

Relationship Between L1 and L3

The disposition of the electrically conductive particles is designed so that a sufficient number of electrically conductive particles for stable conduction can exist at at least the locations of the terminals. Specifically, a preferable disposition of the electrically conductive particles may be designed so that, in the resulting anisotropically electrically conductive connection structure, electrically conductive particles will exist in from 1 to 5 rows, preferably from 1 to 3 rows, in the terminal width direction, and in the terminal length direction, from several to approximately 20 electrically conductive particles will exist in each of the rows. Also, it is preferable that the rows of the captured electrically conductive particles be not parallel to the terminal length direction. Thus, the rows of captured electrically conductive particles may be configured not to be parallel to the terminal length direction. This configuration ensures that extreme imbalance in the number of captured particles will not occur at the ends of the terminals extending in the longitudinal direction, either in a terminal array in one electronic component or in a terminal array in a different electronic component. When the rows of captured electrically conductive particles are parallel to the ends of the terminals extending in the longitudinal direction, an extreme phenomenon may occur in which, in the case where electrically conductive particles are captured, all of them in the row are captured and, in the case where electrically conductive particles are not captured, none of them in the row are captured. That is, to produce anisotropically electrically conductive connection structures of a certain level or higher level of quality, the configuration described above is preferred.

Here, a fine pitch is defined as a configuration in which the width of the terminal to be connected is less than 30 μm and a normal pitch is defined as a configuration in which the width is greater than or equal to 30 μm. In the case of a fine pitch, a single row of electrically conductive particles may exist within the width of each terminal. When the terminal width is sufficiently large, less than or equal to three rows may exist within the width.

In the case of a normal pitch, L1<L3 is preferred. This is because one first axis A1 per terminal is sufficient for capturing a sufficient number of electrically conductive particles depending on the setting of an angle θ1 and the particle pitch L1 of the electrically conductive particles along the first axes A1. The angle θ1 is an angle formed by the first axes A1 with the film width direction. In contrast, in the case of a fine pitch, L3 is specified on the basis of, for example, the size of the terminals (length to width ratio), the spacing between adjacent terminals, the height of the terminals, or the degree of smoothness of the surface of the terminals.

Minimum Interparticle Spacing L2 between Adjacent First Axes A1

The minimum interparticle spacing L2 between adjacent first axes A1 is greater than or equal to the axis pitch L3 of the first axes A1. As described above, when L3 is greater than or equal to 1.5D to provide a sufficient interparticle spacing, L2 is also greater than or equal to 1.5D, and thus the risk of short-circuits can be avoided. Optimum L2 spacings are derived from the relationship between L1 and L3.

Three Lattice Axes Oriented Oblique to Film Width

In the anisotropic electrically conductive film 1 of the present example, extensions of all sides of a triangle formed by an electrically conductive particle P0, an electrically conductive particle P1, and an electrically conductive particle P2 constitute the lattice axes. The electrically conductive particle P0 is any one of the electrically conductive particles at any one of the first axes A1. The electrically conductive particle P1 is at the one of the first axes A1 and adjacent to the electrically conductive particle P0. The electrically conductive particle P2 is at another one of the first axes A1 that is adjacent to the one of the first axes A1. The electrically conductive particle P2 is spaced from the electrically conductive particle P0 by the minimum interparticle spacing L2. With regard to these lattice axes, the first axis A1 passing through the electrically conductive particles P0 and P1, the second axis A2 passing through the electrically conductive particles P0 and P2, and the third axis A3 passing through the electrically conductive particles P1 and P2 are all oblique to the film width direction of the anisotropic electrically conductive film 1. This configuration eliminates the problem that may occur in the alignment between the anisotropic electrically conductive film 1 and the terminals 3 for anisotropically electrically conductive connection. Specifically, the problem is that, when a misalignment occurs in a direction, some electrically conductive particles P may be linearly aligned along an edge of the terminal 3 and all the electrically conductive particles P may deviate from the terminal 3 and consequently fail to contribute to connection. This effect increases when the terminal 3 to be connected via the anisotropic electrically conductive film has a fine pitch.

When the terminal 3 has a normal pitch, the axis pitch L3 can be sufficiently large relative to the electrically conductive particle pitch L1, and accordingly, the arrangements of the electrically conductive particles P can be represented by the angle θ1, which is an angle formed by the first axes A1 with the film width direction, the electrically conductive particle pitch L1, and the axis pitch L3. Thus, the arrangements of the electrically conductive particles P can be represented by the angle θ1 of the first axes A1, the electrically conductive particle pitch L1, and the axis pitch L3. This facilitates the designing for minimizing the number density of the electrically conductive particles.

Furthermore, the three lattice axes A1, A2, and A3 are oblique to the film width direction. Thus, there is no need to arrange any of the lattice axes A1, A2, and A3 to be parallel to the longitudinal direction of the anisotropic electrically conductive film. As a result, both high performance anisotropically electrically conductive connection and high productivity are achieved in a compatible manner.

Preferred magnitudes of the angle θ1, which is formed by the first axes A1 with the film width direction, an angle θ2, which is formed by the second axes A2 with the film width direction, and an angle θ3, which is formed by the third axes A3 with the film width direction, depend on a pitch Lp, the width Lq, and the length Lr of the terminals 3 to be connected.

An angle θ1a, which is an upper limit of the angle θ1 formed by the first axes A1 with the film width direction, is as follows, for example. In FOG connection, the terminal pitch Lp can be assumed to be approximately 400 μm at maximum, and a preferred particle diameter D of the electrically conductive particles P is greater than or equal to 2.5 μm. Assuming that L/S=1 and that the lattice axes are tilted toward the film longitudinal direction by an amount corresponding to the electrically conductive particle diameter (2.5 μm) within a terminal width (200 μm), as indicated by the dash-dot-dot line in FIG. 1, the angle θ1a, which is an upper limit angle formed by the first axes A1 and the film width direction, is A TAN (200/2.5)=1.558 rad=89.29°.

In COG connection, a single chip includes terminals having a plurality of sizes. In such a case, the setting is made on the basis of the minimum size terminal. For example, when the chip to be connected has a terminal width of 4.5 μm and a terminal length of 111 μm, the lower limit of the angle θ1, which is formed by the first axes A1 and the film width direction, is A TAN (4.5/111)=0.405 rad=2.3°.

Furthermore, in the case of COG connection, the design is such that the first axes A1 are arranged to be oblique to the terminal longitudinal direction so that at least three of the first axes A1 can straddle the minimum size terminal and the distance between centers of adjacent electrically conductive particles at L1 and L2 satisfies the condition of greater than or equal to 1.5 times the electrically conductive particle diameter. With this configuration, the electrically conductive particles P on the first axes A1 are prevented from being linearly aligned along the film width direction, and as a result, variations in the number of captured electrically conductive particles on the terminals are reduced. In particular, in the case of a fine pitch, as illustrated in FIG. 1, electrically conductive particles Pa, Pb, and Pc, which are adjacent to one another in the film width direction, are preferably in a state in which tangent lines Lb1 and Lb2 in the film width direction overlap the electrically conductive particles Pa and Pb, i.e., the tangent lines Lb1 and Lb2 pass through the electrically conductive particles Pa and Pb.

The angle θ1, which is formed by the first axes A1 and the film width direction, is preferably less than or equal to the angle determined as described above on the basis of, for example, the pitch Lp and the length of the terminal to be connected via the anisotropic electrically conductive film. In particular, from the standpoint of connection reliability, the angle θ1 is preferably greater than or equal to 22° when the electrically conductive particle diameter is greater than or equal to 3 μm.

The angle θ2 is an angle formed by the second axes A2 and the film width direction. The second axis A2 passes through the electrically conductive particle P0 and the electrically conductive particle P2, which is spaced from the electrically conductive particle P0 by the minimum interparticle spacing L2. The angle θ2 is less than 90°, and preferably ranges from 3° to 87°, in order to capture the electrically conductive particles sufficiently even if a misalignment occurs in the alignment between the anisotropic electrically conductive film and the terminals and to ensure ease of production of the anisotropic electrically conductive film.

The above-described angles θ1, θ2, and θ3 are angles in the anisotropic electrically conductive film prior to connection. The angles may not be maintained for electrically conductive particles captured by the terminals after anisotropically electrically conductive connection. For example, even when the angle formed by the arrangements of the first axes A1 with the longitudinal direction of the terminals is θ1 prior to connection, angles that deviate from θ1 may be formed in the arrangements of electrically conductive particles captured by the terminals after connection. Prior to connection, the first axes A1 are arranged side by side parallel to one another, but on the terminals after connection, the arrangements of the first axes A1 arranged side by side may not necessarily be parallel to one another.

Specific Example of Arrangements

The anisotropic electrically conductive film of the present invention may have any of a variety of types of arrangements described below provided that the first axes A1, the second axes A2, and the third axes A3 are oblique to the film width direction as described above. In the examples described below, the sphericity of the electrically conductive particles P is greater than or equal to 90% and the average particle diameter D is 3 μm.

Figure 4:
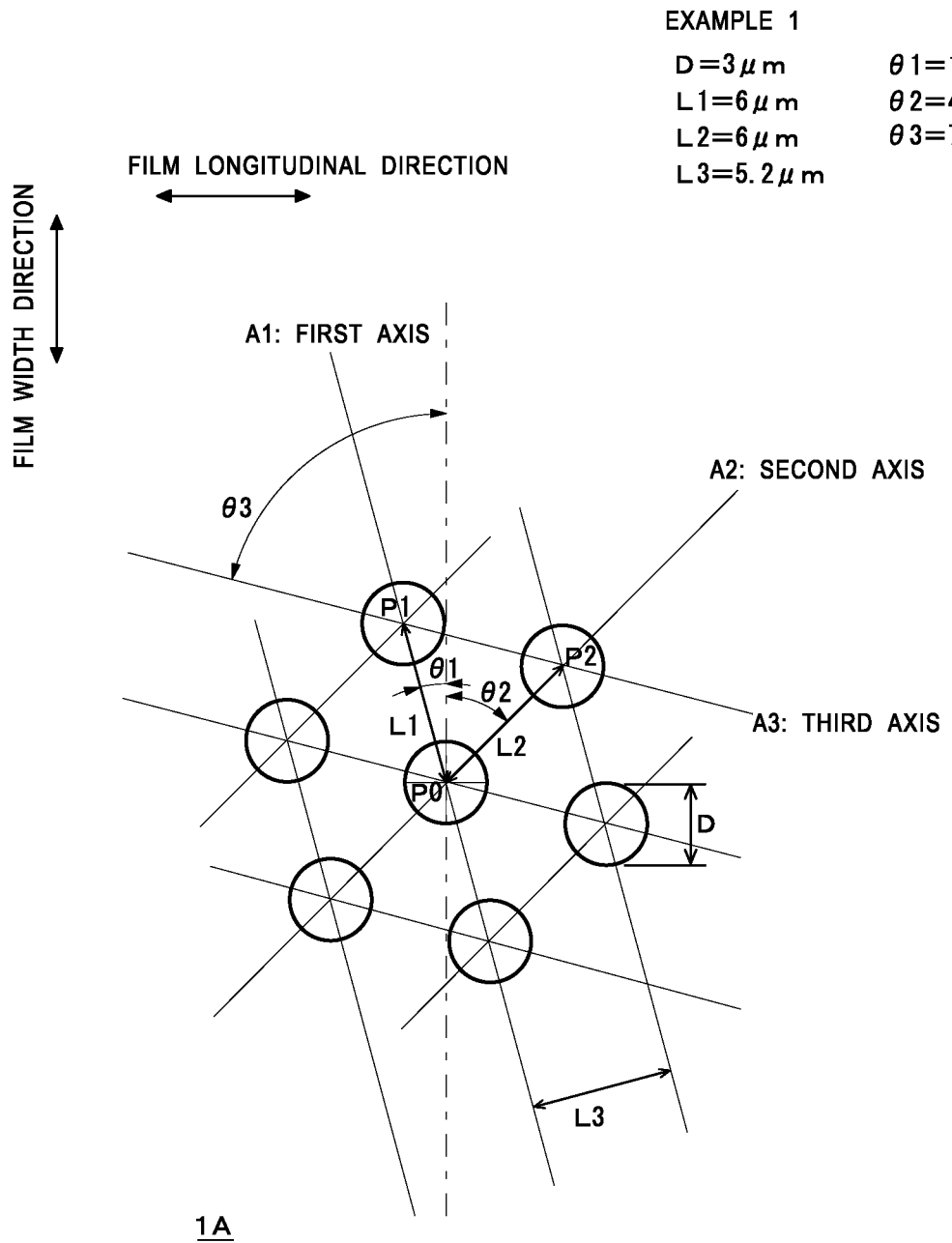
FIG. 4 is a diagram illustrating disposition of electrically conductive particles in an anisotropic electrically conductive film 1A of an example.

For example, in an anisotropic electrically conductive film 1A, illustrated in FIG. 4, the electrically conductive particle pitch L1 is 6 μm, the minimum interparticle spacing L2 is 6 μm, the axis pitch L3 is 5.2 μm, the angle θ1, which is formed by the first axes A1 with the film width direction, is 15°, the angle θ2, which is formed by the second axes A2 with the film width direction, is 45°, and the angle θ3, which is formed by the third axes A3 with the film width direction, is 75°. In the anisotropic electrically conductive film 1A, the electrically conductive particles P are disposed in arrangements of hexagonal lattices, and all the three lattice axes A1, A2, and A3 are oblique to the film width direction of the anisotropic electrically conductive film. The anisotropic electrically conductive film 1A may be preferably used for anisotropically electrically conductive connection for COG.

Figure 5:
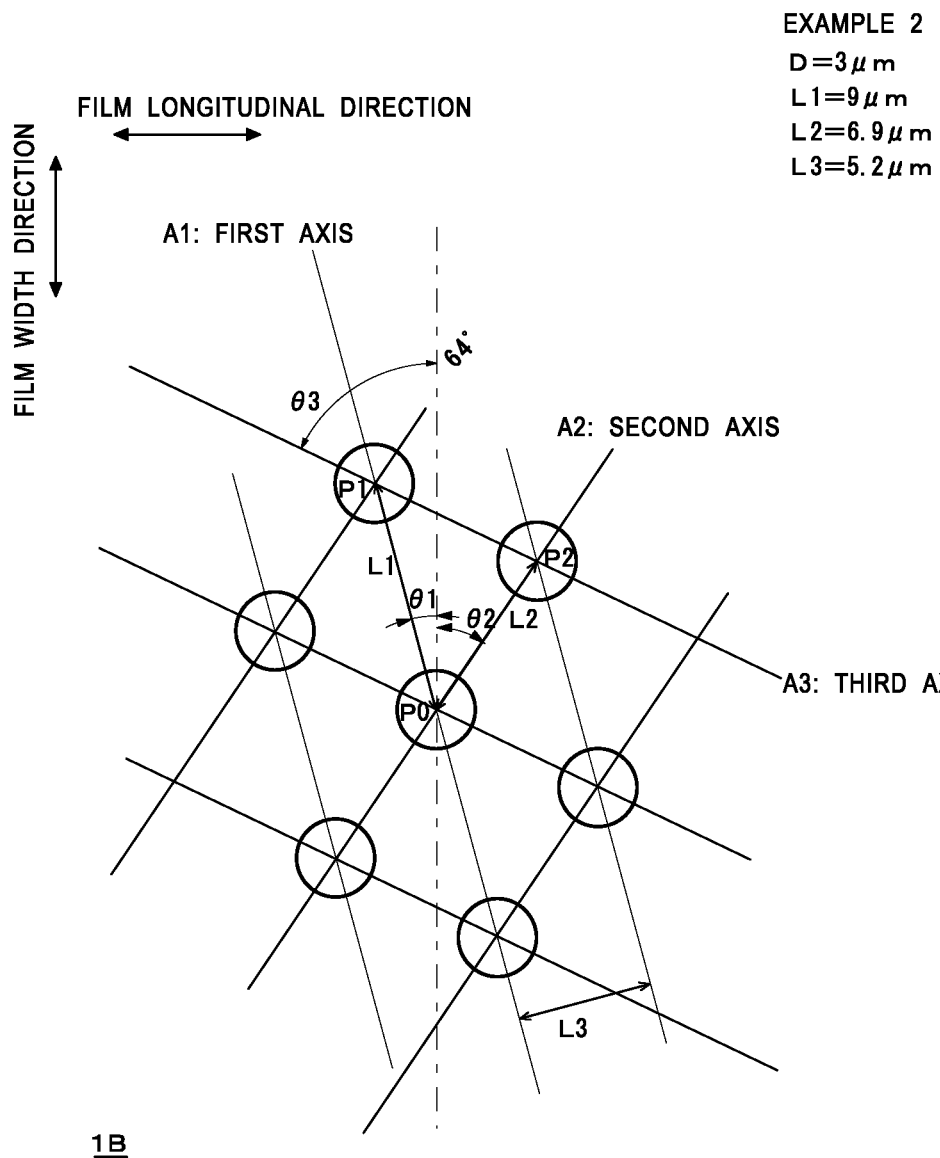
FIG. 5 is a diagram illustrating disposition of electrically conductive particles in an anisotropic electrically conductive film 1B of an example.

In an anisotropic electrically conductive film 1B, illustrated in FIG. 5, the arrangements of the electrically conductive particles are extended in the direction of the first axes A1 as compared with the arrangements in the anisotropic electrically conductive film 1A illustrated in FIG. 4. In the arrangements, the electrically conductive particle pitch L1 is 9 μm, the minimum interparticle spacing L2 is 6.9 μm, the axis pitch L3 is 5.2 μm, the angle θ1, which is formed by the first axes A1 with the film width direction, is 15°, the angle θ2, which is formed by the second axes A2 with the film width direction, is 34°, and the angle θ3, which is formed by the third axes A3 with the film width direction, is 64°.

The anisotropic electrically conductive film 1B may be preferably used for anisotropically electrically conductive connection for COG.

Figure 6:
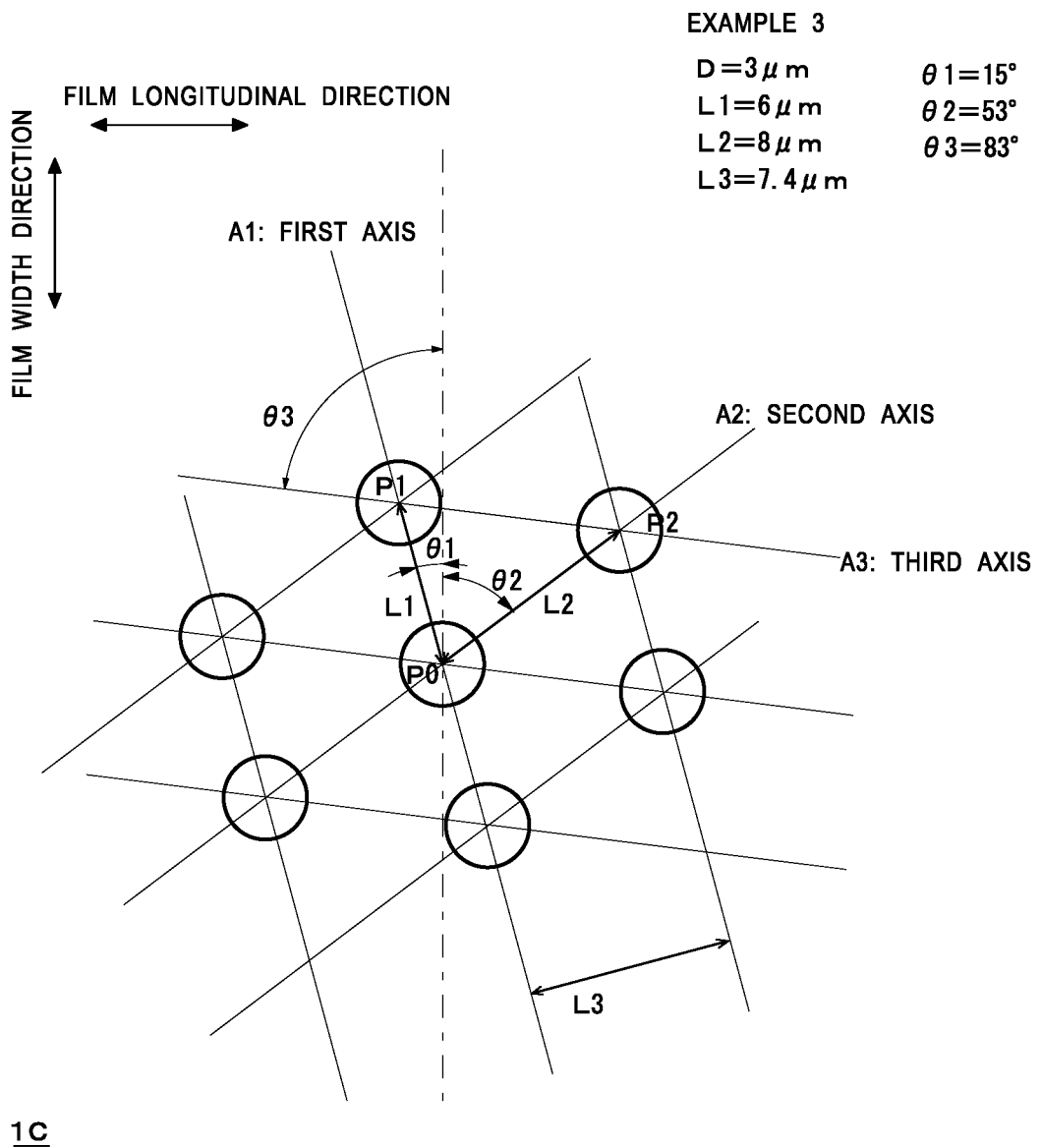
FIG. 6 is a diagram illustrating disposition of electrically conductive particles in an anisotropic electrically conductive film 1C of an example.

In an anisotropic electrically conductive film 1C, illustrated in FIG. 6, the arrangements of the electrically conductive particles are extended in a direction perpendicular to the direction of the first axes A1 as compared with the arrangements in the anisotropic electrically conductive film 1A illustrated in FIG. 4. In the arrangements, the electrically conductive particle pitch L1 is 6 μm, the minimum interparticle spacing L2 is 8 μm, the axis pitch L3 is 7.4 μm, the angle θ1, which is formed by the first axes A1 with the film width direction, is 15°, the angle θ2, which is formed by the second axes A2 with the film width direction, is 53°, and the angle θ3, which is formed by the third axes A3 with the film width direction, is 83°.

The anisotropic electrically conductive film 1C may be preferably used for anisotropically electrically conductive connection for COG.

Figure 7:
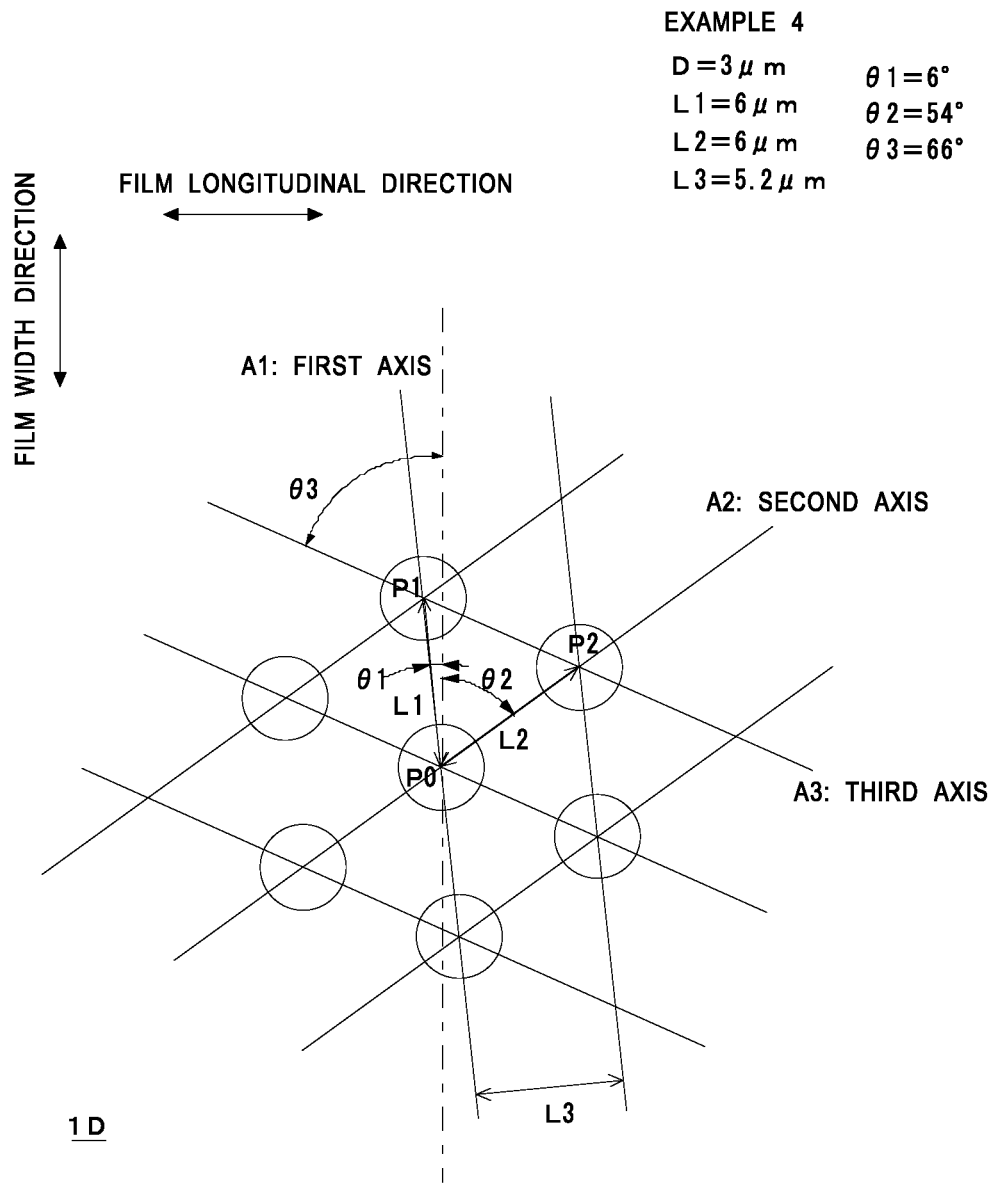
FIG. 7 is a diagram illustrating disposition of electrically conductive particles in an anisotropic electrically conductive film 1D of an example.

In an anisotropic electrically conductive film 1D, illustrated in FIG. 7, the angle θ1, which is formed by the first axes A1 with the film width direction, is 6° as compared with the anisotropic electrically conductive film 1A illustrated in FIG. 4. In the arrangements, the electrically conductive particle pitch L1 is 6 μm, the minimum interparticle spacing L2 is 6 μm, the axis pitch L3 is 5.2 μm, the angle θ1, which is formed by the first axes A1 with the film width direction, is 6°, the angle θ2, which is formed by the second axes A2 with the film width direction, is 54°, and the angle θ3, which is formed by the third axes A3 with the film width direction, is 66°.

The anisotropic electrically conductive film 1D may be preferably used for anisotropically electrically conductive connection for COG.

Figure 11:
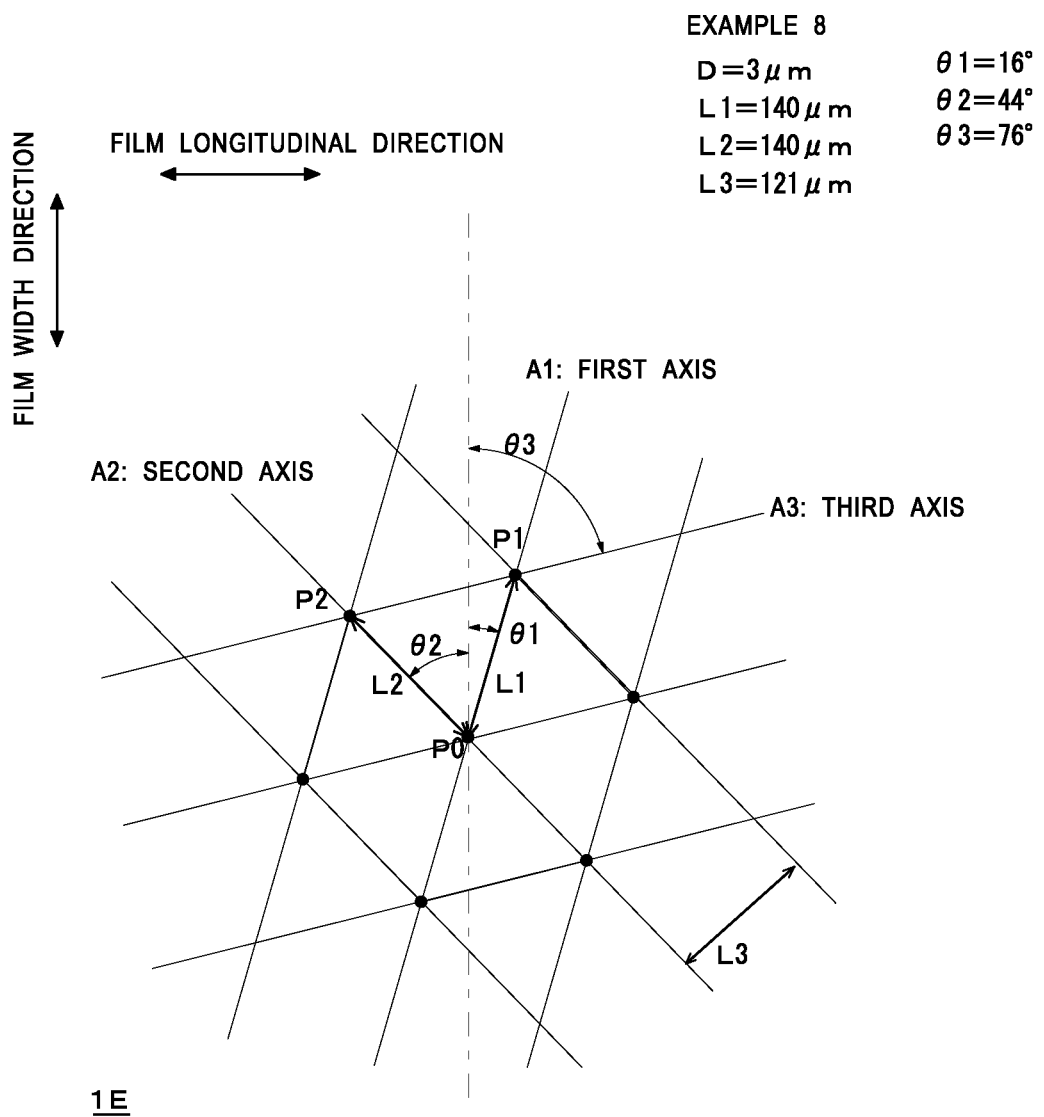
FIG. 11 is a diagram illustrating disposition of electrically conductive particles in an anisotropic electrically conductive film 1E of an example.

In an anisotropic electrically conductive film 1E, illustrated in FIG. 11, the electrically conductive particle pitch L1 and other parameters are increased by a factor of approximately 20 as compared with the above-described anisotropic electrically conductive films 1A to 1D. Specifically, the electrically conductive particle pitch L1 is 140 μm, the minimum interparticle spacing L2 is 140 μm, the axis pitch L3 is 121 μm, the angle θ1, which is formed by the first axes A1 with the film width direction, is 16°, the angle θ2, which is formed by the second axes A2 with the film width direction, is 44°, and the angle θ3, which is formed by the third axes A3 with the film width direction, is 76°.

The anisotropic electrically conductive film 1E may be preferably used for anisotropically electrically conductive connection for FOG.

Figure 12:
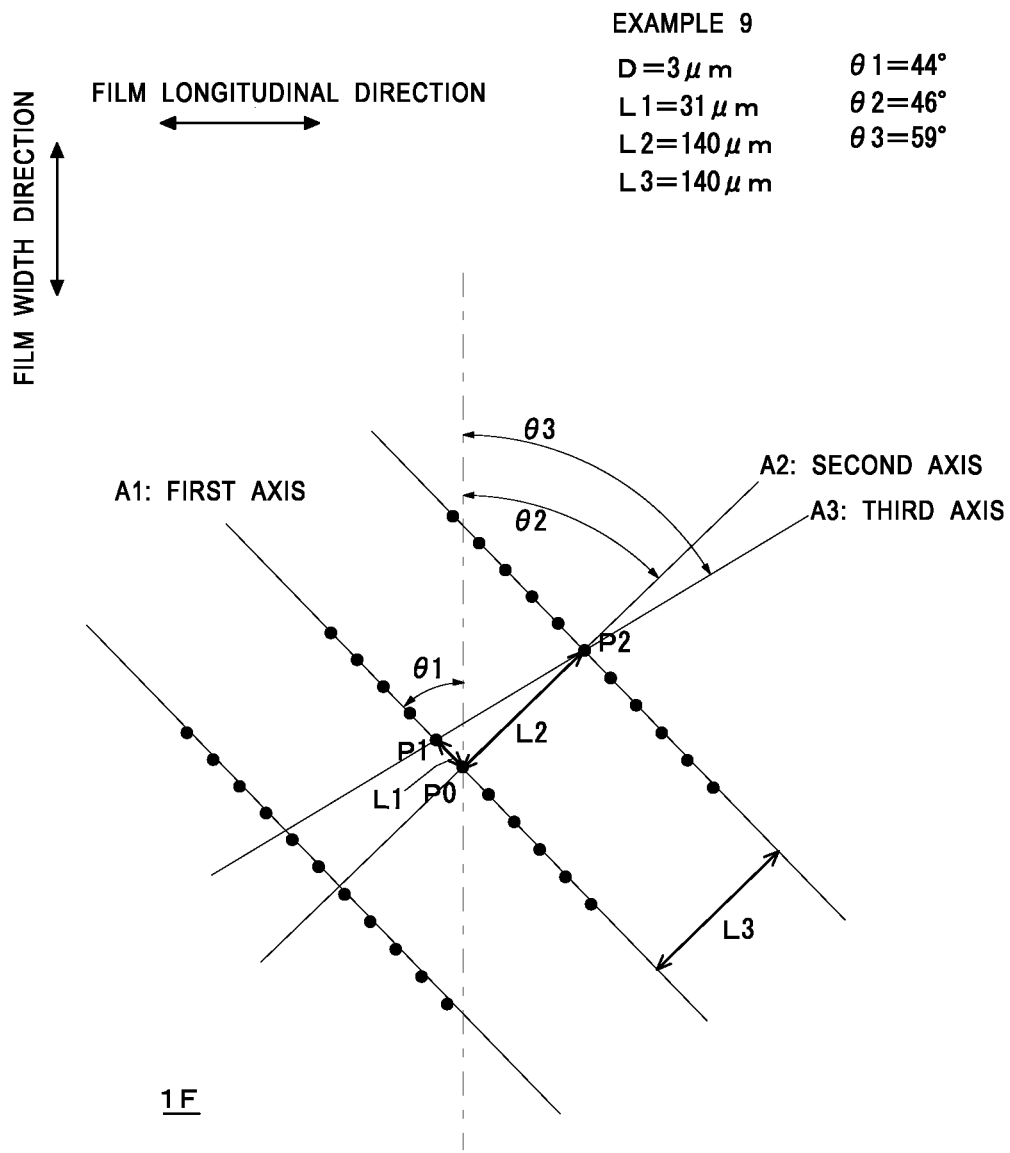
FIG. 12 is a diagram illustrating disposition of electrically conductive particles in an anisotropic electrically conductive film 1F of an example.

In an anisotropic electrically conductive film 1F, illustrated in FIG. 12, the electrically conductive particle pitch L1 is reduced by a factor of approximately 1/5 as compared with the above-described anisotropic electrically conductive film 1E. Specifically, the electrically conductive particle pitch L1 is 31 μm, the minimum interparticle spacing L2 is 140 μm, the axis pitch L3 is 140 μm, the angle θ1, which is formed by the first axes A1 with the film width direction, is 44°, the angle θ2, which is formed by the second axes A2 with the film width direction, is 46°, and the angle θ3, which is formed by the third axes A3 with the film width direction, is 59°. When the axis pitch L3 is sufficiently large relative to the particle pitch L1 as described above, disposition of the particles along the first and third axes, for the design of disposition of the electrically conductive particles, may be defined on the assumption that the angle θ2, which is formed by the second axes with the film width direction, and the angle θ3, which is formed by the third axes with the film width direction, are equal. In this case, it is preferable that axes that form a small angle with the film width direction be designated as the first axes from the standpoint of particle capturing capability on the terminals.

The anisotropic electrically conductive film 1F may be preferably used for anisotropically electrically conductive connection for FOG.

Figure 13:
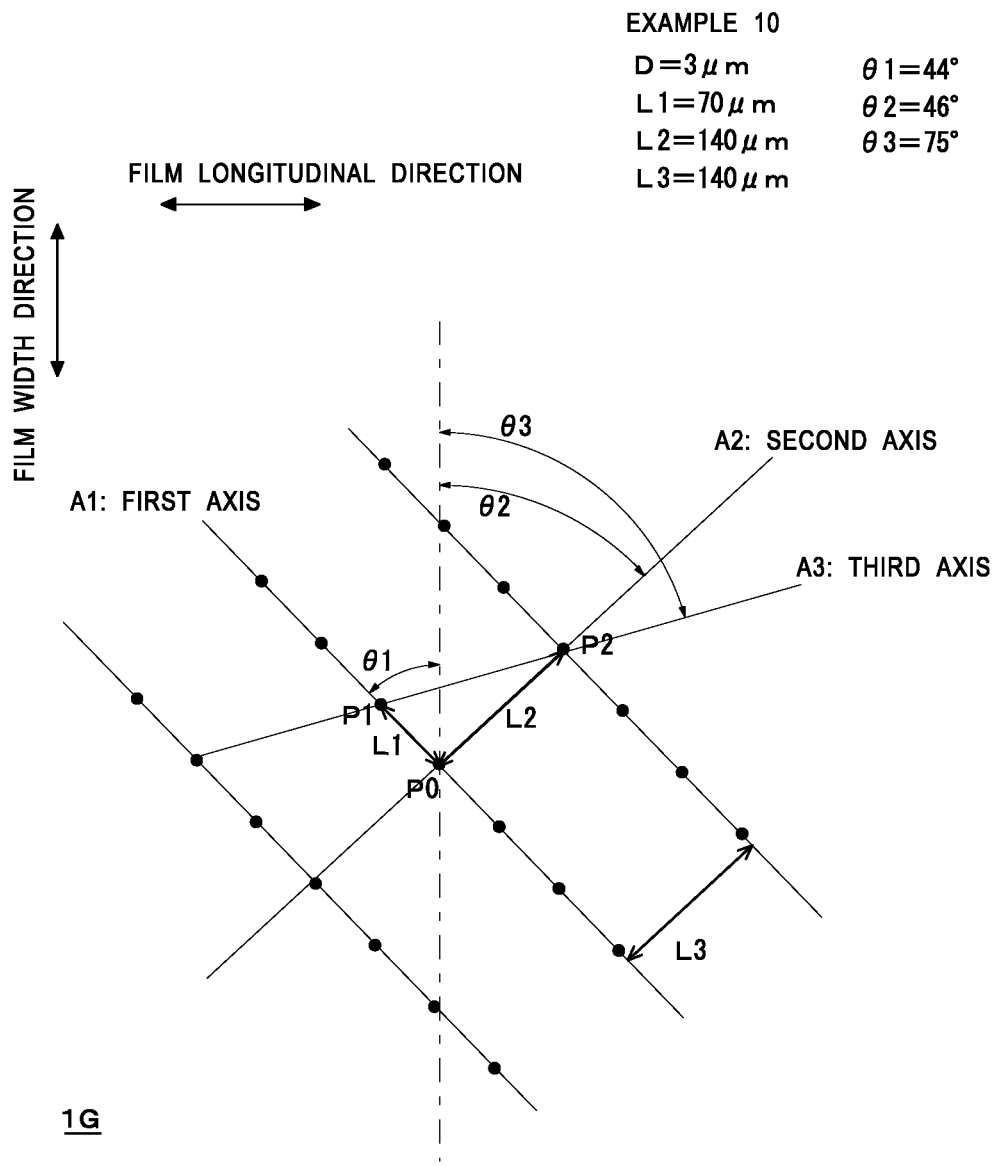
FIG. 13 is a diagram illustrating disposition of electrically conductive particles in an anisotropic electrically conductive film 1G of a comparative example.

In an anisotropic electrically conductive film 1G, illustrated in FIG. 13, the electrically conductive particle pitch L1 is increased as compared with the above-described anisotropic electrically conductive film 1F. Specifically, the electrically conductive particle pitch L1 is 70 μm, the minimum interparticle spacing L2 is 140 μm, the axis pitch L3 is 140 μm, the angle θ1, which is formed by the first axes A1 with the film width direction, is 44°, the angle θ2, which is formed by the second axes A2 with the film width direction, is 46°, and the angle θ3, which is formed by the third axes A3 with the film width direction, is 75°.

The anisotropic electrically conductive film 1G may be preferably used for anisotropically electrically conductive connection for FOG.

Figure 3B:
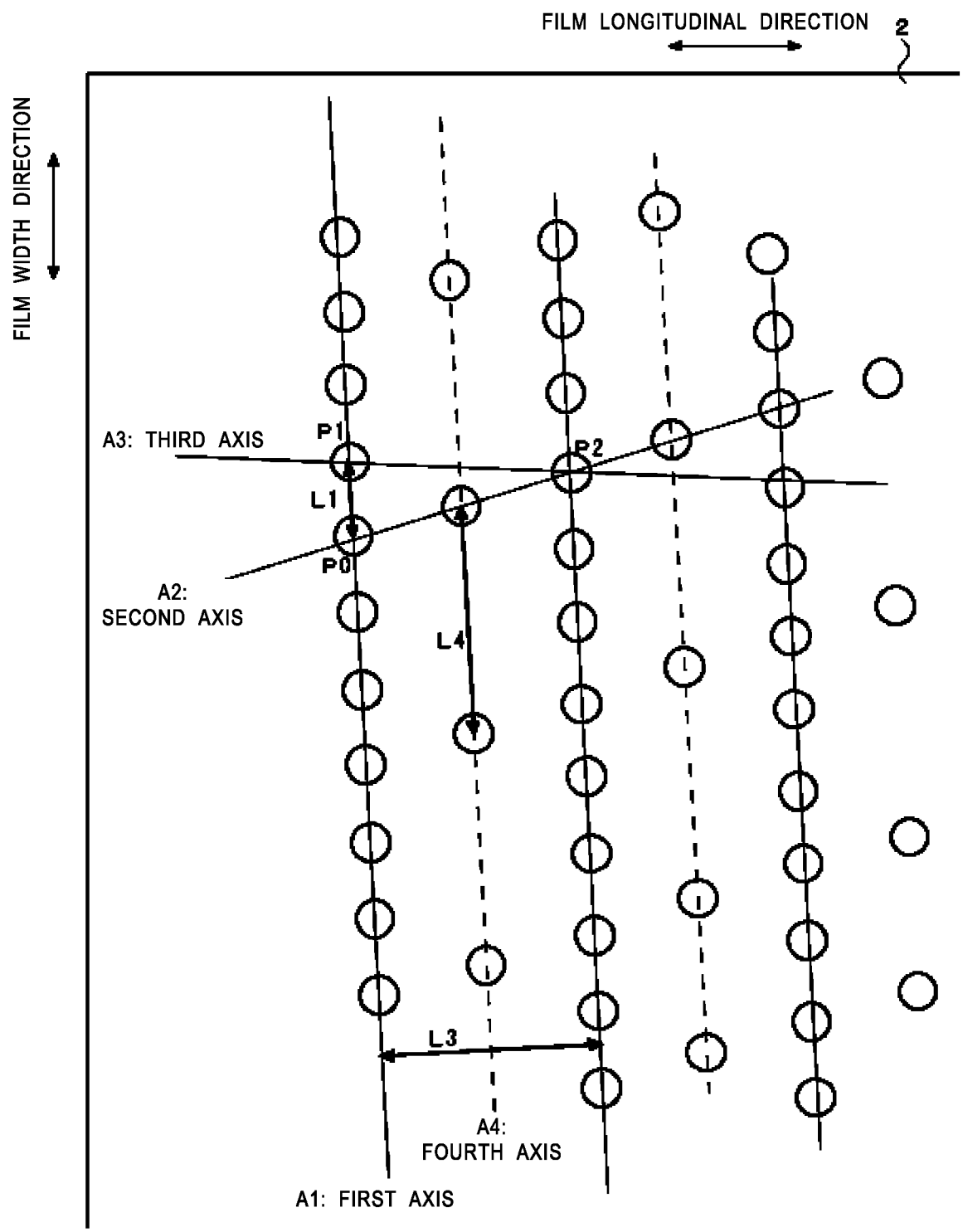
FIG. 3B is a diagram illustrating a modified example of disposition of electrically conductive particles in an anisotropic electrically conductive film.

As described above, the disposition configuration of the electrically conductive particles may be in a hexagonal lattice form or in the form of the lattice being enlarged or shortened in a predetermined direction (e.g., FIGS. 1 and 4). For each of the axes, the electrically conductive particle pitch may be varied in a regular manner (FIG. 3A). Furthermore, for example, fourth axes A4, as additional arrangement axes, may be added to the first axes A1, the second axes A2, and the third axes A3, as illustrated in FIG. 3B. The fourth axes A4 have an electrically conductive particle pitch L4. In the embodiment of FIG. 3B, the fourth axes A4 are parallel to the first axes A1. The disposition of the electrically conductive particles in FIG. 3B can be regarded as follows. The first axes A1 are arranged side by side at a predetermined axis pitch. The fourth axes A4, disposed at a predetermined spacing, constitute some of the first axes. Some of the first axes are arranged to the forth axes A4 disposed at a predetermined spacing, provided that, along the fourth axes A4, some electrically conductive particles among the electrically conductive particles disposed at a predetermined spacing, are missing in a regular manner. That is, the anisotropic electrically conductive film of the present invention may have a particle disposition such as follows. The lattice axes may include the fourth axes, which are in the same direction as the first axes, the second axes, or the third axes. The fourth axes may have arrangements of electrically conductive particles corresponding to the arrangements of the first axes, the second axes, or the third axes except that some electrically conductive particles among the electrically conductive particles are missing in a regular manner. The first axes, the second axes, or the third axes are in the same direction as the fourth axes. The fourth axes and the first axes, the second axes, or the third axes, which are in the same direction and have different particle pitches, each have a predetermined axis pitch. Merely packing electrically conductive particles densely can result in increased costs because electrically conductive particles will exist at locations that do not contribute to connection. Furthermore, merely laying out electrically conductive particles at high density can be a cause of short-circuits depending on the spacing between adjacent terminals. However, by appropriately removing electrically conductive particles from the arrangements of the electrically conductive particles made up of the first axes A1, the second axes A2, and the third axes A3, a cost increase will be inhibited and the occurrence of short-circuits may be reduced.

Another embodiment of the arrangements of the electrically conductive particles may be such that, in arrangements in triangular lattice form, electrically conductive particles in one arrangement axis direction may form a zigzag row. For example, when the terminals are disposed in a staggered lattice, the number of electrically conductive particles existing between terminals can be relatively reduced.

Method for Fixing Electrically Conductive Particles

One method for disposing the electrically conductive particles P in the lattice form arrangements described above in the electrically insulating adhesive layer 2 and fixing the particles therein may be as follows. A mold having concavities corresponding to the arrangements of the electrically conductive particles P is produced by a known method, such as machining, laser processing, or photolithography. The electrically conductive particles are placed in the mold, an electrically insulating adhesive layer forming composition is supplied thereto, and the resultant is removed from the mold. In this manner, the electrically conductive particles can be transferred onto the electrically insulating adhesive layer. Moreover, this mold may then be used to fabricate a mold made of a material with lower rigidity.

Another method for disposing the electrically conductive particles P in the lattice form arrangements described above in the electrically insulating adhesive layer 2 may be as follows. On the electrically insulating adhesive layer forming composition layer, a member having through holes in predetermined positions is provided. The electrically conductive particles P are supplied from above to be passed through the through holes.

Another method may be as follows. A sheet member on which projections approximately similar in size to the electrically conductive particles are arranged is produced. A weak adhesive layer is formed on the top surfaces of the projections and the electrically conductive particles are placed to adhere thereto, so that the electrically conductive particles can be transferred onto the electrically insulating adhesive layer. As described above, there are no particular limitations on the method for producing the anisotropic electrically conductive film of the present invention.

Layer Configuration

The layer configuration may be in any of a variety of forms. For example, the electrically conductive particles may be disposed on a monolayer of electrically insulating adhesive layer and the electrically conductive particles may be pushed into the electrically insulating adhesive layer so that the electrically conductive particles can exist at a certain depth from the interface of the electrically insulating adhesive layer.

Other configurations may be as follows. The electrically conductive particles are disposed on a monolayer of electrically insulating adhesive layer and thereafter another electrically insulating adhesive layer is laminated thereto to form an electrically insulating adhesive layer of a bilayer configuration. By repeating this process, a configuration of three or more layers may be provided. The purposes of forming two or more electrically insulating adhesive layers are, for example, to improve the tackiness and to control the flow of the resin and the electrically conductive particles when performing anisotropically electrically conductive connection.

To fix the electrically conductive particles, a photopolymerizable resin and a photopolymerization initiator may be included in an electrically insulating adhesive layer forming composition, and the composition may be irradiated with light to fix the electrically conductive particles. A reactive resin that does not contribute to anisotropically electrically conductive connection may be used to fix the electrically conductive particles and for the transfer described above.

Electrically Insulating Adhesive Layer

As the electrically insulating adhesive layer 2, any of electrically insulating resin layers included in known anisotropic electrically conductive films may be appropriately employed. Examples thereof include a photo-radical polymerization type resin layer containing an acrylate compound and a photo-radical polymerization initiator, a thermal radical polymerization type resin layer containing an acrylate compound and a thermal radical polymerization initiator, a thermal cationic polymerization type resin layer containing an epoxy compound and a thermal cationic polymerization initiator, a thermal anionic polymerization type resin layer containing an epoxy compound and a thermal anionic polymerization initiator, and the like. Polymerized products of these resin layers may be used as necessary in order to fix the electrically conductive particles P to the electrically insulating adhesive layer 2. As described in the layer configuration section, the electrically insulating adhesive layer 2 may include a plurality of resin layers.

As necessary, an electrically insulating filler, such as silica, may be mixed with the electrically insulating adhesive layer 2 to fix the electrically conductive particles P to the electrically insulating adhesive layer 2.

The size of the electrically insulating filler preferably ranges from 10 to 2000 nm, and the amount of the electrically insulating filler in the mixture preferably ranges from 1 to 60 parts by mass per 100 parts by mass of resin included in the electrically insulating adhesive layer 2.

The lowest melt viscosity of the electrically insulating adhesive layer 2, whether the electrically insulating adhesive layer 2 is monolayer or laminate, preferably ranges from 10 to 10000 Pa·s in terms of the lowest melt viscosity of the whole. When the viscosity is within this range, the electrically conductive particles can be fixed to any locations precisely, and also, the electrically insulating adhesive layer 2 does not interfere with anisotropically electrically conductive connection. Diversification of the connection method and the electronic components to be connected can be addressed. The lowest melt viscosity may be determined in the following manner, for example. A rotary rheometer (manufactured by TA Instruments) is used, a rate of temperature increase of 10° C./min and a measurement pressure of 5 g are maintained to be constant, and a measurement plate of 8 mm in diameter is used.

Connection Structure

The anisotropic electrically conductive film of the present invention can be advantageously employed when anisotropically electrically conductively connecting, by heat or light, a first electronic component, such as an FPC, an IC chip, or an IC module, to a second electronic component, such as an FPC, a rigid substrate, a ceramic substrate, or a glass substrate. Moreover, IC chips or IC modules may be stacked, and then anisotropically electrically conductive connections may be performed between these adjacent first electronic components. Note that the electronic components that can be connected using the anisotropic electrically conductive film of the present invention are not limited to these. Connection structures formed in this way are included within the scope of the present invention.

One method for connecting electronic components together using the anisotropic electrically conductive film may be as follows, for example. One interface of the anisotropic electrically conductive film is temporarily bonded to a second electronic component such as a wiring substrate. The one interface is the interface where the electrically conductive particles are present in the vicinity in the film thickness direction. A first electronic component, such as an IC chip, is mounted on the temporarily bonded anisotropic electrically conductive film, and thermal compression bonding is performed from the first electronic component side. This method is preferable from the standpoint of increasing the connection reliability. A photocuring process may be used to make the connections.

EXAMPLES

Next, the present invention will be described in detail on the basis of examples.

Example 1, Comparative Example 1

1. Production of Anisotropic Electrically Conductive Film

To investigate the influence of the sphericity of the electrically conductive particles on the conduction characteristics of the anisotropic electrically conductive film, anisotropic electrically conductive films for COG were produced. Each of the films included an electrically insulating adhesive layer having a composition shown in Table 1 and electrically conductive particles shown in the table were disposed therein in the arrangements illustrated in FIG. 4.

Specifically, in Example 1, electrically conductive particles having a sphericity of greater than or equal to 90% (average particle diameter: 3 μm) were used. The electrically conductive particles were produced by preparing resin cores using a method described below and forming a plating layer thereon.

Preparation of Resin Core

A microparticulate dispersion was obtained by adding benzoyl peroxide as a polymerization initiator to an aqueous dispersion having an adjusted mixing ratio of divinylbenzene, styrene, and butyl methacrylate, heating the mixture while uniformly stirring at a high speed, and performing a polymerization reaction. This fine particle dispersion was filtered and dried under reduced pressure. Thus, an aggregate of fine particles, that is, a block body was obtained. Furthermore, the block body was crushed and classified by size. Thus, as the resin cores, divinylbenzene-based resin particles with an average particle diameter of 3 μm were obtained. The hardness of the particles was adjusted by adjusting the mixing ratio between divinylbenzene, styrene, and butyl methacrylate.

Formation of Plating Layer

A palladium catalyst was supported on the obtained divinylbenzene resin particles (5 g) by an immersion method. Next, these resin particles were subjected to electroless nickel plating using an electroless nickel plating solution (pH: 12, plating solution temperature: 50° C.) prepared from nickel sulfate hexahydrate, sodium hypophosphite, sodium citrate, triethanolamine, and thallium nitrate. Thus, nickel-coated resin particles having a nickel plating layer as the surface metal layer were obtained.

Subsequently, the nickel-coated resin particles (12 g) were mixed with a solution obtained by dissolving 10 g of sodium chloroaurate in 1000 mL of ion-exchanged water. Thus, an aqueous suspension was prepared. 15 g of ammonium thiosulfate, 80 g of ammonium sulfite, and 40 g of ammonium hydrogen phosphate were added to the obtained aqueous suspension. Thus, a gold plating bath was prepared. After adding 4 g of hydroxylamine to the gold plating bath, ammonia was used to adjust the pH of the gold plating bath to 9, and then the bath temperature was maintained at 60° C. for about 15 to 20 minutes. Thus, electrically conductive particles having a gold-plated layer formed on the surface of the nickel-plated layer were produced.

In Comparative Example 1, electrical conductive glass rods having a cylindrical shape (average major axis length: 4 µm; average minor axis length: 3.9 µm; sphericity: less than 0.8) were used. The cylindrical electrically conductive glass rods were obtained by pressurizing and dividing cylindrical electrically conductive glass particles (PF-39SSSCA, Nippon Electric Glass Co., Ltd., average minor axis length: 3.9 µm; average major axis length: 14 µm) and classifying them by size. The sphericity was less than 70%.

The resin compositions each having a composition shown in Table 1 were prepared and were each applied onto a PET film having a film thickness of 50 µm. The films were dried in an oven at 80° C. for 5 minutes. Thus, a first electrically insulating resin layer of 15 µm in thickness and a second electrically insulating resin layer of 5 µm in thickness were formed on the respective PET films.

Furthermore, a mold having convex arrangements patterns corresponding to the particle arrangements illustrated in FIG. 4 was fabricated, conventionally known transparent resin pellets were melted and, while melted, poured into the mold, and the melted transparent resin was cooled and allowed to harden. Thus, a resin mold having concavities in the arrangements patterns illustrated in FIG. 4 was formed.

The electrically conductive particles were loaded into the concavities of the resin mold, the second electrically insulating resin layer described above was placed thereover, and this was subjected to pressing at 60° C. and at 0.5 MPa to accomplish bonding. Subsequently, the insulating resins were removed from the mold, and the first electrically insulating resin layer was laminated, at 60° C. and at 0.5 MPa, to one interface of each of the second electrically insulating resin layers to produce anisotropic electrically conductive films of Example 1 and Comparative Example 1. The one interface was the interface where the electrically conductive particles were present.

2. Evaluation

Evaluations were made in the following manner regarding (a) initial conduction resistance, (b) indentation, and (c) electrically conductive particle capturing capability in the case where COG connection was made using the anisotropic electrically conductive film produced in Example 1 or Comparative Example 1. Results are shown in Table 1.

(a) Initial Conduction Resistance

The following IC for evaluation and a glass substrate were used as electronic components to be COG-connected.

IC for evaluation
IC dimensions: 1.8 mm×20 mm×0.2 mm
Gold bump: 15 µm (height)×15 µm (width)×100 µm (length)
Gap (space) between bumps: 15 µm
Glass substrate
Glass material: Manufactured by Corning Inc.
Dimensions: 30×50 mm
Thickness: 0.5 mm
Terminal: ITO wiring The anisotropic electrically conductive films of Example 1 and Comparative Example 1 were each sandwiched between the IC for evaluation and the glass substrate and thermocompressively bonded (180° C., 80 MPa, 5 seconds) so as to obtain each connected object for evaluation. The longitudinal direction of the anisotropic electrically conductive films and the short-side direction of the terminals were in the same direction.

The conduction resistance of each connected object for evaluation was measured using a digital multi-meter (34401A, manufactured by Agilent Technologies, Inc.) by a four-probe technique (JIS K7194). If the value was 2Ω or less, the connected object for evaluation was evaluated as being suitable for practical use.

(b) Indentation

The connected objects for evaluation obtained in (a) were observed from the glass substrate side using a metallurgical microscope. Two hundred electrically conductive particles captured by the terminals were examined for the degree of crushing or fragmentation. The number of electrically conductive particles having a crushing percentage of greater than or equal to 120% (electrically conductive particles having an area increased to greater than or equal to 120% from the area prior to connection) was determined, and the ratio of the number to the total number of the electrically conductive particles was calculated. The result of Example 1 was greater than or equal to 90%. The crushing percentage of Comparative Example 1 was determined assuming that the average minor axis length of the cylinder was the average particle diameter. Although the particles had been classified, their conditions were difficult to ascertain because they had been fragmented. The ratio was estimated to be less than 40%.

Compression percentages, which are calculated by the following equation, were determined for electrically conductive particles crushed between the terminals. In Example 1, greater than or equal to 90% of the particles had a compression percentage ranging from 70% to 80%. In Comparative Example 1, the compression percentage was not determined because the degree of crushing was not uniform.

Compression percentage={(height of held electrically conductive particle obtained by cross-sectional observation)/(average particle diameter of electrically conductive particle between terminals)}×100

In Example 1, the indentation formed by each electrically conductive particle was easily identified and the connection status was more easily evaluated by the indentation and the cross-sectional shape of the particle after connection than in Comparative Example 1. This indicates that, when the electrically conductive particles are spherical, checking for a pass/fail of the connection status is easy.

(c) Particle Capturing Capability

ICs having a bump width of 15 µm, a gap between bumps of 15 µm, and a bump length of 100 µm, which were the same as the ones used in (a), were prepared as ICs for evaluation. Using Flip Chip Bonder FC-1000 (Toray Engineering Co., Ltd.), the ICs were mounted while making alignment so that the 15 µm of the bump width would be a connected region. Thus, connected objects for evaluation were obtained (effective bump width: 15 μm). Similarly, the ICs were mounted while intentionally causing a misalignment so that 5 μm of the bump width would be a connected region (effective bump width: 5 μm). Thus, connected objects for evaluation were obtained. For each of the connected objects, the number of captured electrically conductive particles was investigated by observing indentations from the glass surface. Evaluations were made on the basis of the following criteria. If the score was C or higher, the connected object for evaluation was evaluated as being suitable for practical use.
A: 10 or more particles
B: from 5 to less than 10 particles
C: from 3 to less than 5 particles
D: less than 3 particles

TABLE 1

|  | Comparative Example 1 | Example 1 |
|---|---|---|
| First electrically insulating resin layer (layer thickness: 15 μm) | | |
| Phenoxy resin (*1) (parts by mass) | 30 | 30 |
| Epoxy resin (*2) (parts by mass) | 40 | 40 |
| Cationic curing agent (*3) (parts by mass) | 2 | 2 |
| Second electrically insulating resin layer (layer thickness: 5 μm) | | |
| Phenoxy resin (*1) (parts by mass) | 30 | 30 |
| Epoxy resin (*2) (parts by mass) | 40 | 40 |
| Cationic curing agent (*3) (parts by mass) | 2 | 2 |
| Filler (*4) (parts by mass) | 30 | 30 |
| Electrically conductive particles | | |
| Particle shape | Cylindrical | Spherical |
| Electrically conductive particle diameter (μm) | 4 | 3 |
| Number density (per mm$^2$) | 32000 | 32000 |
| Arrangement | | |
| Arrangement pattern | FIG. 4 | FIG 4 |
| Angle θ1(°), formed by first axes with film width | 15 | 15 |
| Angle θ2(°), formed by second axes with film width | 45 | 45 |
| Angle θ3(°), formed by third axes with film width | 75 | 75 |
| Electrically conductive particle pitch L1 of first axes (μm) | 6 | 6 |
| Minimum interparticle spacing L2 between adjacent first axes (μm) | 6 | 6 |
| Axis pitch of first axes (L3) (μm) | 5.2 | 5.2 |
| Evaluation | | |
| Connected object for evaluation (wire width: 15 μm; wire length: 100 μm) | COG | COG |
| Initial electrical conduction resistance (Ω) | 0.6 | 0.2 |
| Indentation (proportion of particles having a crushing percentage of 120% or greater) (%) | <40 | 90≤ |
| Particle capturing capability (effective bump width: 15 μm) | B | A |
| Particle capturing capability (effective bump width: 5 μm) | D | B |

(*1) NIPPON STEEL & SUMITOMO METAL CORPORATION, YP-50 (thermoplastic resin)
(*2) Mitsubishi Chemical Corporation, jER828 (thermosetting resin)
(*3) SANSHIN CHEMICAL INDUSTRY CO., LTD., SI-60L (latent curing agent)
(*4) AEROSIL RX300 (manufactured by NIPPON AEROSIL CO., LTD.)

When the electrically conductive particles were loaded onto the molds in the production processes for the anisotropic electrically conductive films of Comparative Example 1 and Example 1, the time for the operation was much shorter in Example 1 than in Comparative Example 1. Furthermore, in Example 1, the loading of the electrically conductive particles onto the mold was accomplished more smoothly than in Comparative Example 1, and the film area that was usable as an anisotropic electrically conductive film was significantly larger. In other words, the production yield for the anisotropic electrically conductive film was significantly better in Example 1.

Examples 2 to 7, Comparative Examples 2 to 5

To investigate the influence of the arrangements of the electrically conductive particles on the conduction characteristics, anisotropic electrically conductive films for COG of Examples 2 to 7 and Comparative Examples 2 to 5 were produced in the same manner as in Example 1 except that the arrangements of the electrically conductive particles were varied as shown in Table 2. The arrangement patterns of electrically conductive particles of the examples and the comparative examples were as illustrated in the drawings.

Connected objects for evaluation were produced using the obtained anisotropic electrically conductive films, and evaluations of the films were made in the same manner as in Example 1 for (a) initial conduction resistance, (b) indentation, and (c) particle capturing capability. In addition, (d) conduction reliability and (e) short-circuit occurrence rate were evaluated in the following manner.

These results, together with the results of Example 1 are shown in Table 2.

(d) Conduction Reliability

Connected objects for evaluation were produced in the same manner as in 2(a) of Example 1. After being allowed to stand in the thermostatic chamber at a temperature of 85° C. and a humidity of 85% RH for 500 hours, the conduction resistance of the connected objects for evaluation were measured in the same manner as in 2(a). From the perspective of achieving reliable conduction stability between connected electronic components, it is not preferable that this conduction resistance be 5Ω or greater.

(e) Short-Circuit Occurrence Rate

The following ICs (comb-shaped TEG (test element group, space: 7.5 μm)) were prepared as ICs for evaluating the short-circuit occurrence rate.

Dimensions: 1.5×13 mm

Thickness: 0.5 mm

Bump specifications: Gold plated; Height: 15 μm; Size: 25×140 μm; Distance between bumps 7.5 μm The anisotropic electrically conductive films were each sandwiched between the IC for evaluating the short-circuit occurrence rate and glass substrate patterned in a manner corresponding to the IC for evaluation, and these components were thermocompressively bonded under the same connection conditions as in (a) to produce connected objects. The short-circuit occurrence rate in each connected object was then determined. The short-circuit occurrence rate was calculated as the number of short-circuits occurred divided by the total number of 7.5 μm spaces. Among the calculated short-circuit occurrence rates, those of less than 50 ppm were evaluated as good and those of 50 ppm or greater were evaluated as not acceptable.

TABLE 2

Figure 14:
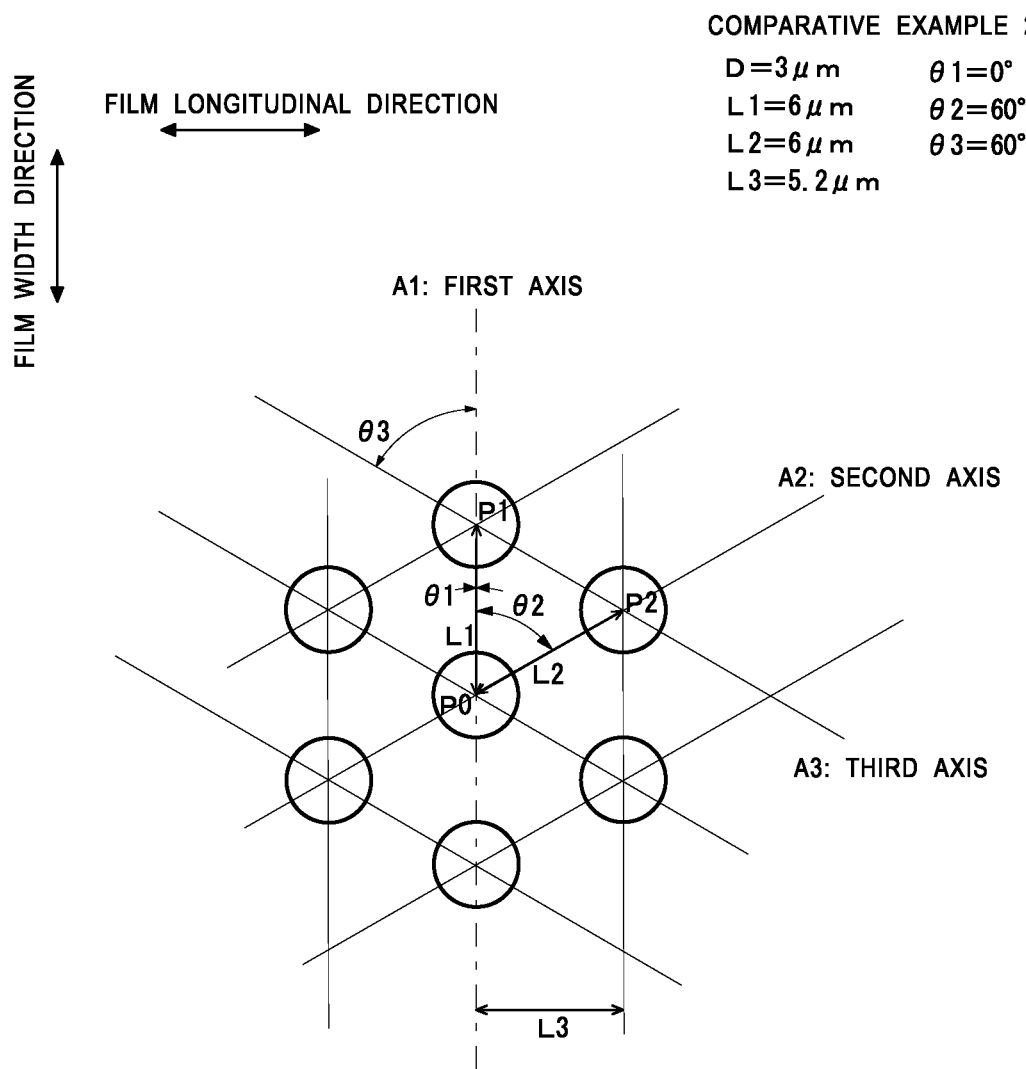
FIG. 14 is a diagram illustrating disposition of electrically conductive particles in an anisotropic electrically conductive film of a comparative example.
Figure 15:
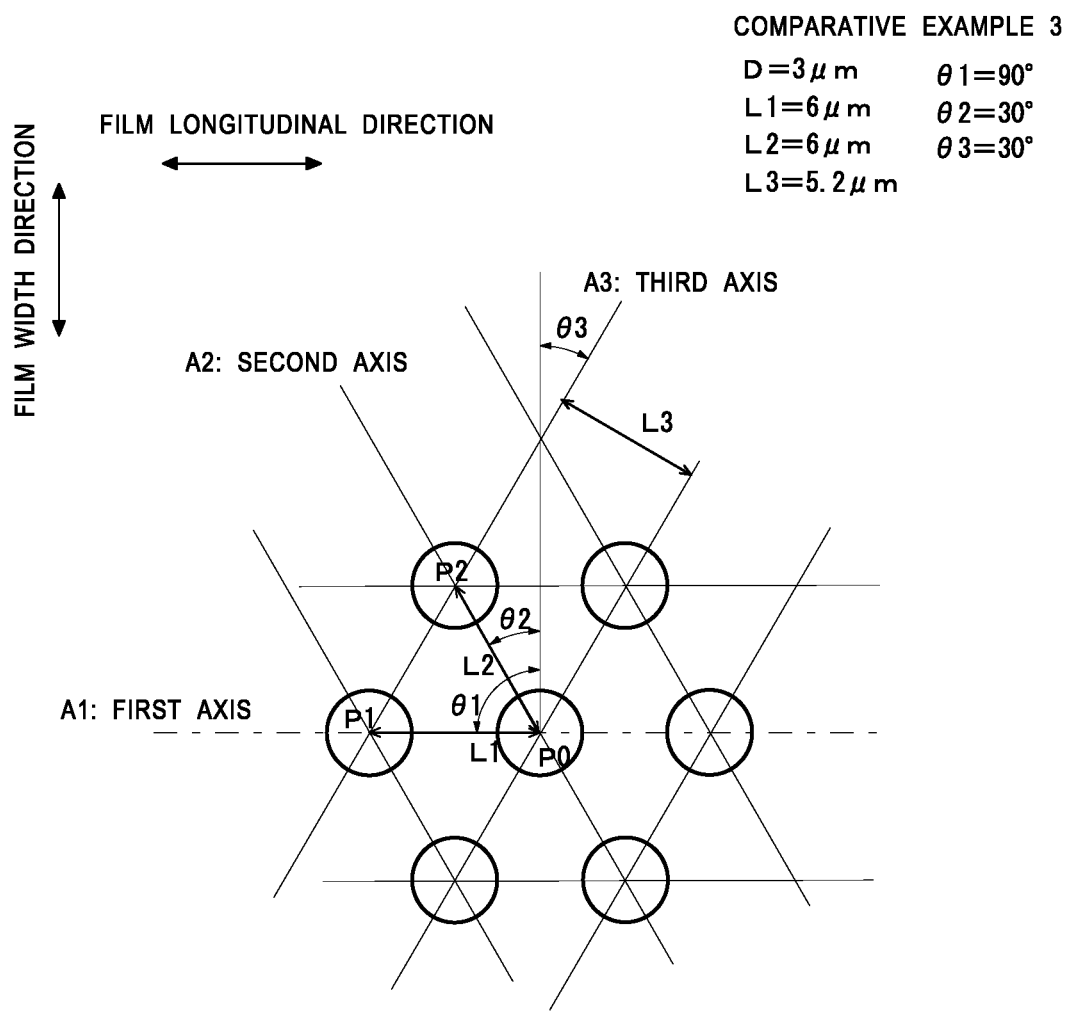
FIG. 15 is a diagram illustrating disposition of electrically conductive particles in an anisotropic electrically conductive film of a comparative example.
Figure 16:
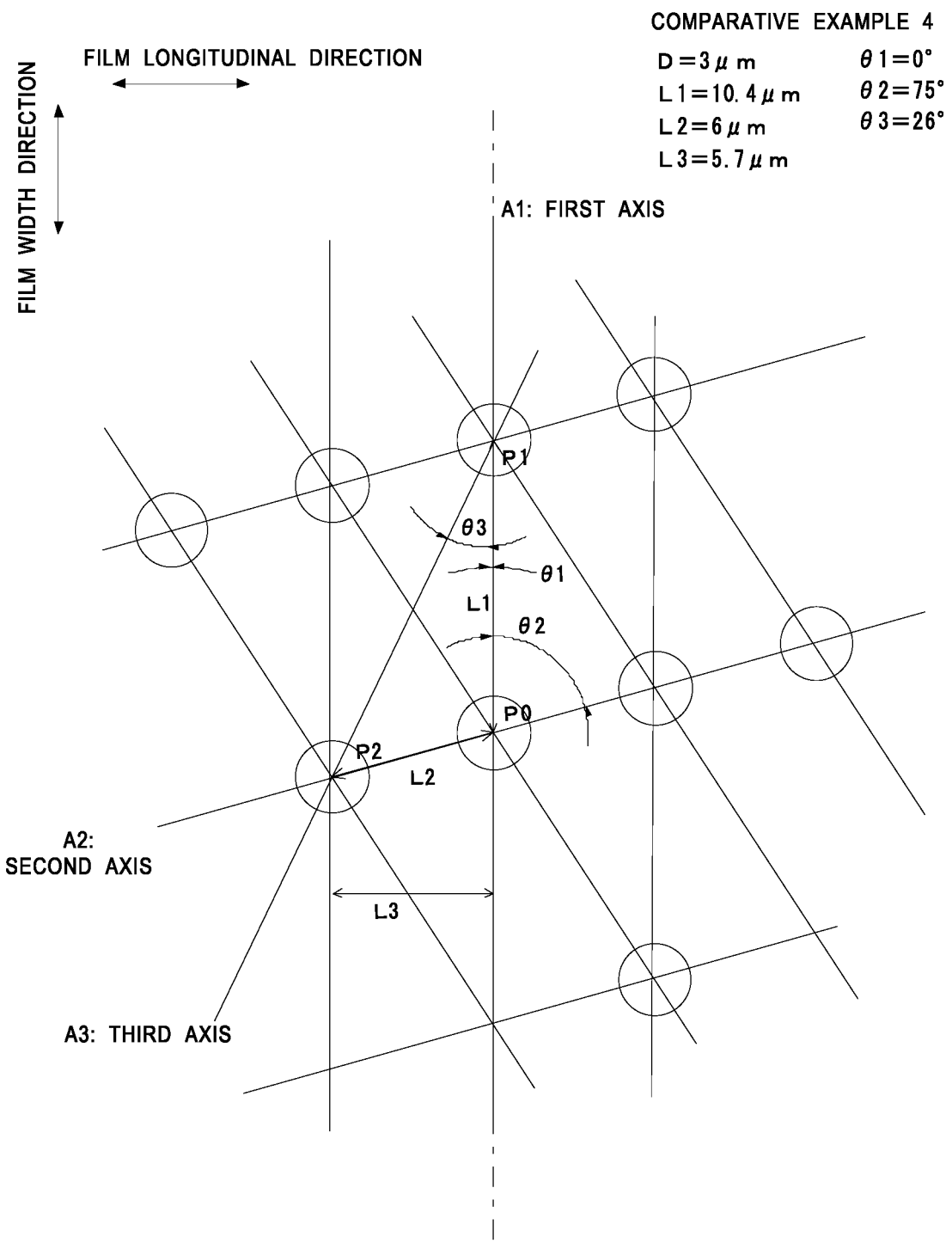
FIG. 16 is a diagram illustrating disposition of electrically conductive particles in an anisotropic electrically conductive film of a comparative example.
Figure 17:
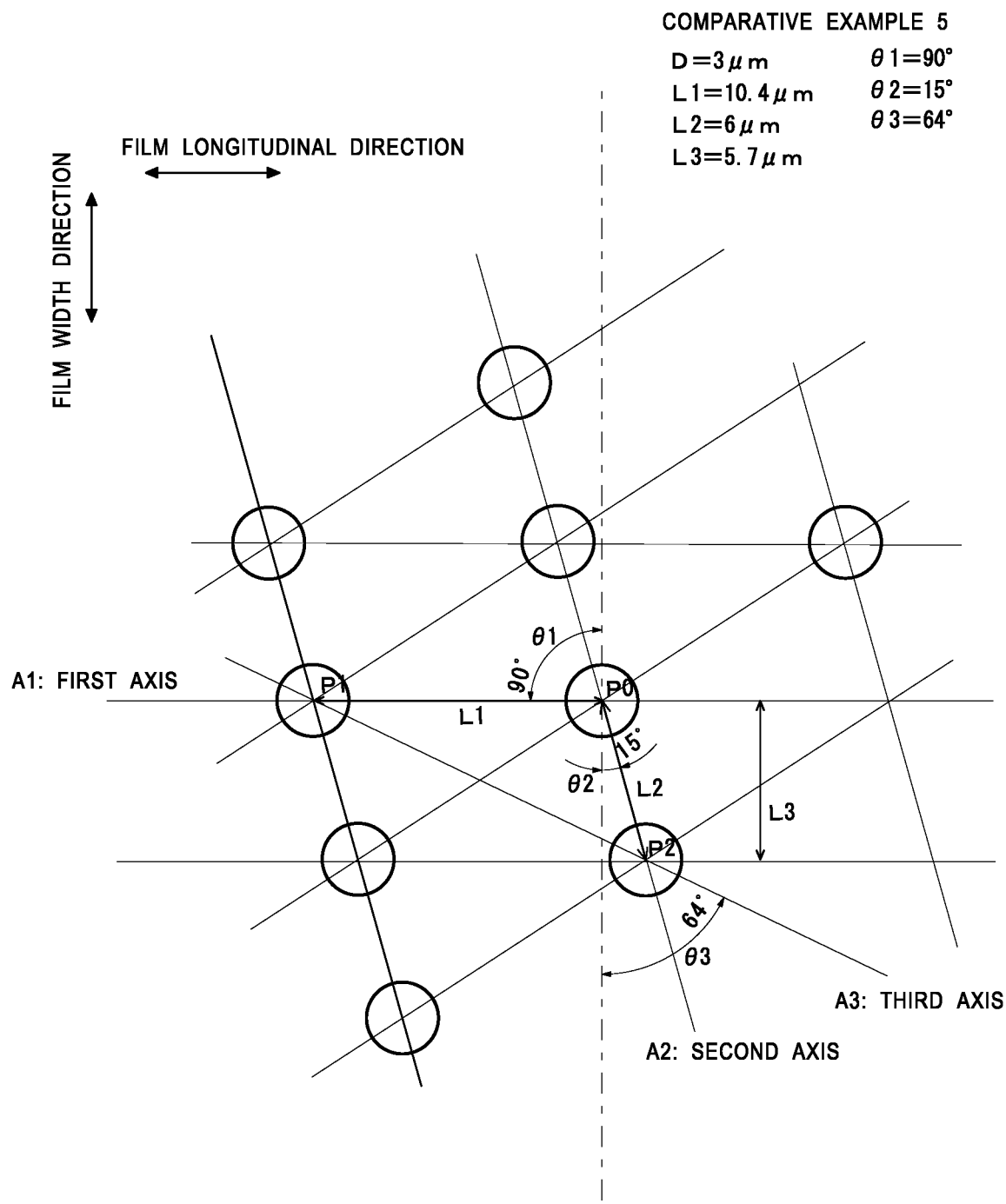
FIG. 17 is a diagram illustrating disposition of electrically conductive particles in an anisotropic electrically conductive film of a comparative example.

|  | Comparative Example 2 | Comparative Example 3 | Comparative Example 4 | Comparative Example 5 | Example 1 | Example 2 |
|---|---|---|---|---|---|---|
| Electrically conductive particles | | | | | | |
| Particle shape | Spherical | Spherical | Spherical | Spherical | Spherical | Spherical |
| Electrically conductive particle diameter (μm) | 3 | 3 | 3 | 3 | 3 | 3 |
| Number density (per mm$^2$) | 32000 | 32000 | 16000 | 16000 | 32000 | 21400 |
| Arrangement | | | | | | |
| Arrangement pattern | FIG. 14 | FIG. 15 | FIG. 16 | FIG. 17 | FIG. 4 | FIG. 5 |
| Angle θ1(°) formed by first axes with film width | 0 | 90 | 0 | 90 | 15 | 15 |
| Angle θ2(°) formed by second axes with film width | 60 | 30 | 75 | 15 | 45 | 34 |
| Angle θ3(°) formed by third axes with film width | 60 | 30 | 26 | 64 | 75 | 64 |
| Electrically conductive particle pitch L1 of first axes (μm) | 6 | 6 | 10.4 | 10.4 | 6 | 9 |
| Minimum interparticle spacing L2 between adjacent first axes (μm) | 6 | 6 | 6 | 6 | 6 | 6.9 |
| Axis pitch of first axes (L3) (μm) | 5.2 | 5.2 | 5.7 | 5.7 | 5.2 | 5.2 |
| Evaluation | | | | | | |
| Connected object for evaluation (wire width: 15 μm; wire length: 100 μm) | COG | COG | COG | COG | COG | COG |
| Initial electrical conduction resistance (Ω) | 0.2 | 0.2 | 0.2 | 0.2 | 0.2 | 0.2 |
| Conduction reliability (Ω) | 2.5 | 2.5 | 2.2 | 2.2 | 2.2 | 2.2 |
| Indentation (proportion of particles having a crushing percentage of 120% or greater) (%) | 90≤ | 90≤ | 90≤ | 90≤ | 90≤ | 90≤ |
| Particle capturing capability (effective bump width: 15 μm) | A | A | A | A | A | A |
| Particle capturing capability (effective bump width: 5 μm) | C | C | D | D | B | C |
| Short-circuit occurrence rate | <50 ppm | <50 ppm | <50 ppm | <50 ppm | <50 ppm | <50 ppm |

Figure 8:
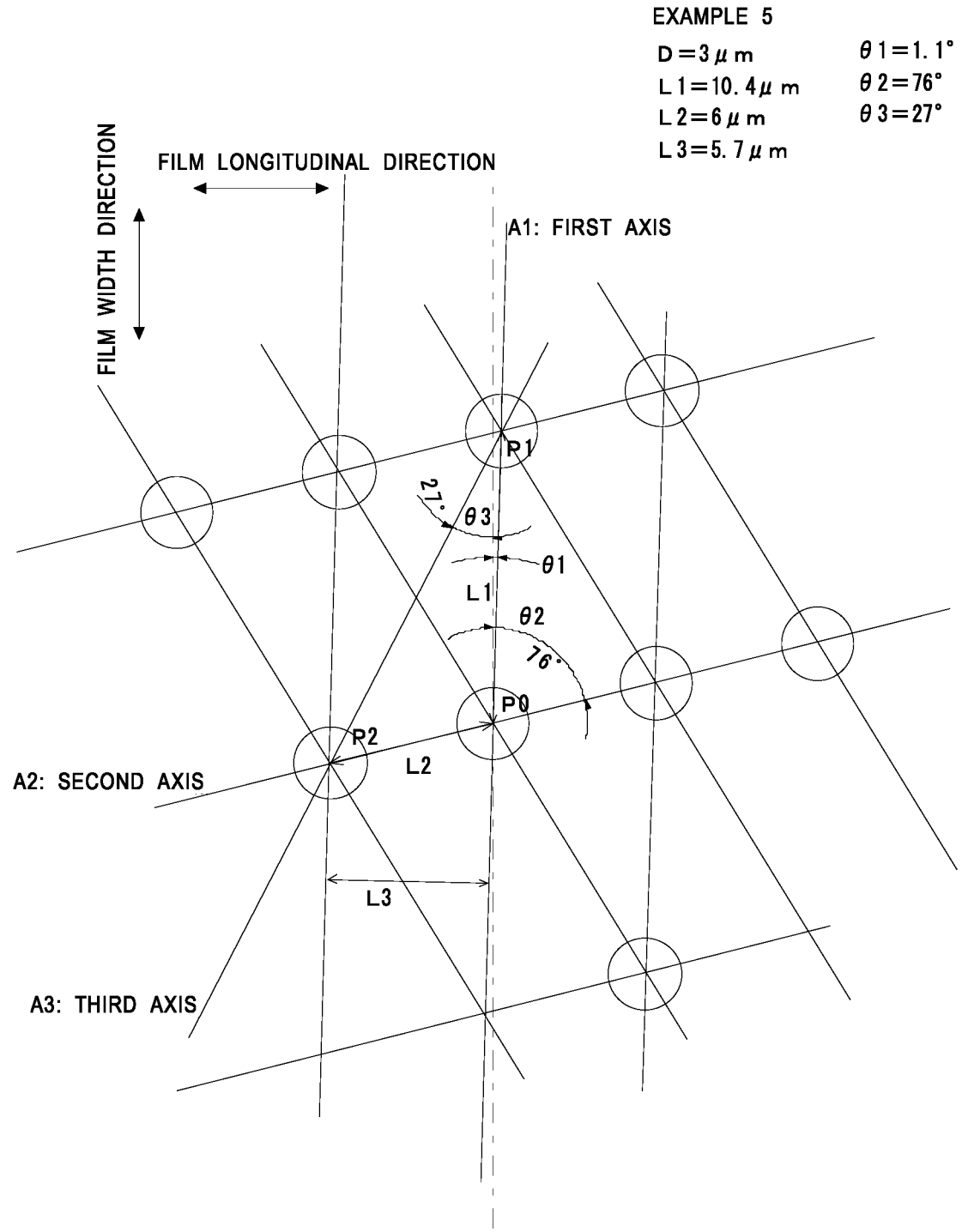
FIG. 8 is a diagram illustrating disposition of electrically conductive particles in an anisotropic electrically conductive film of an example.
Figure 9:
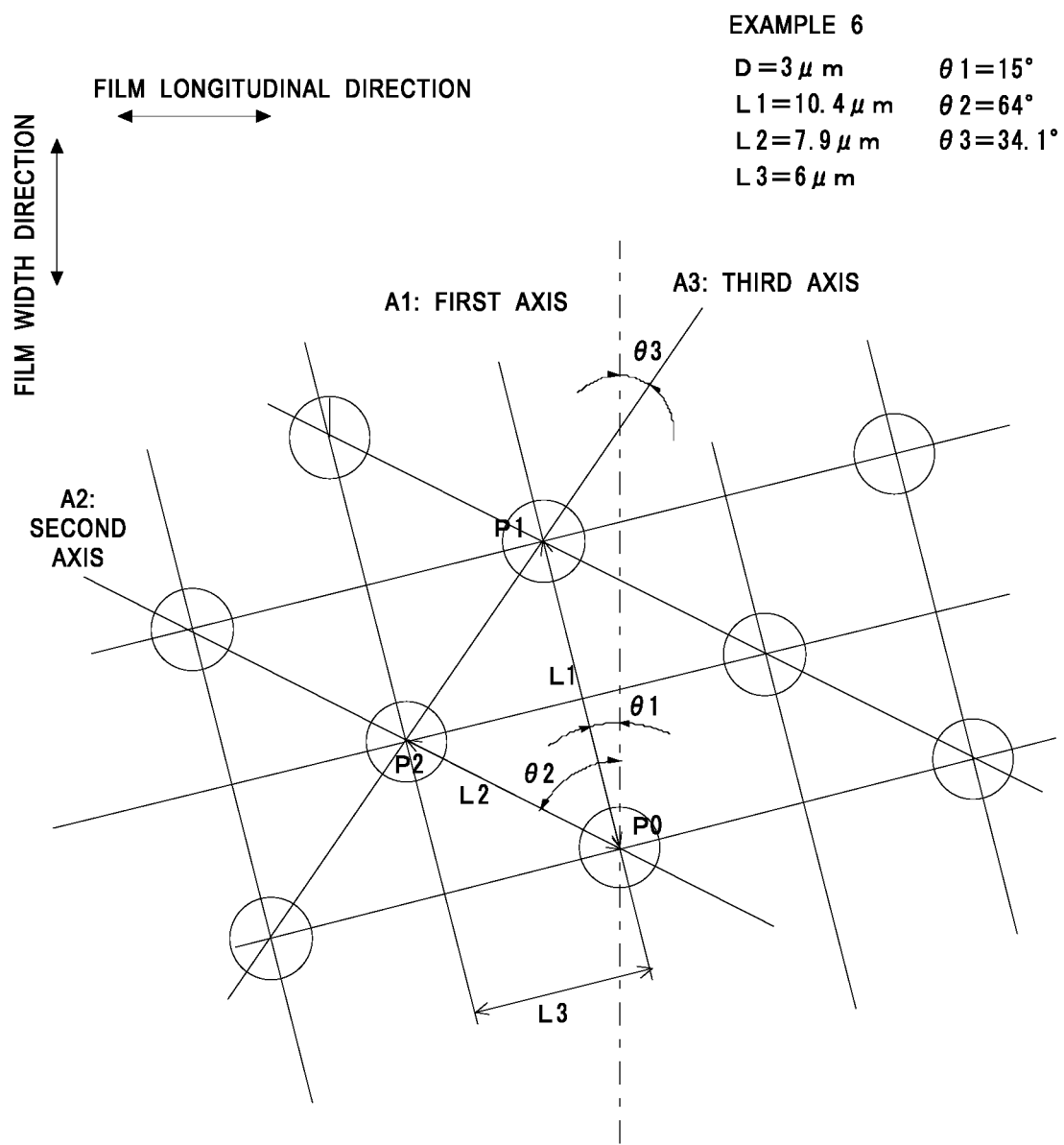
FIG. 9 is a diagram illustrating disposition of electrically conductive particles in an anisotropic electrically conductive film of an example.
Figure 10:
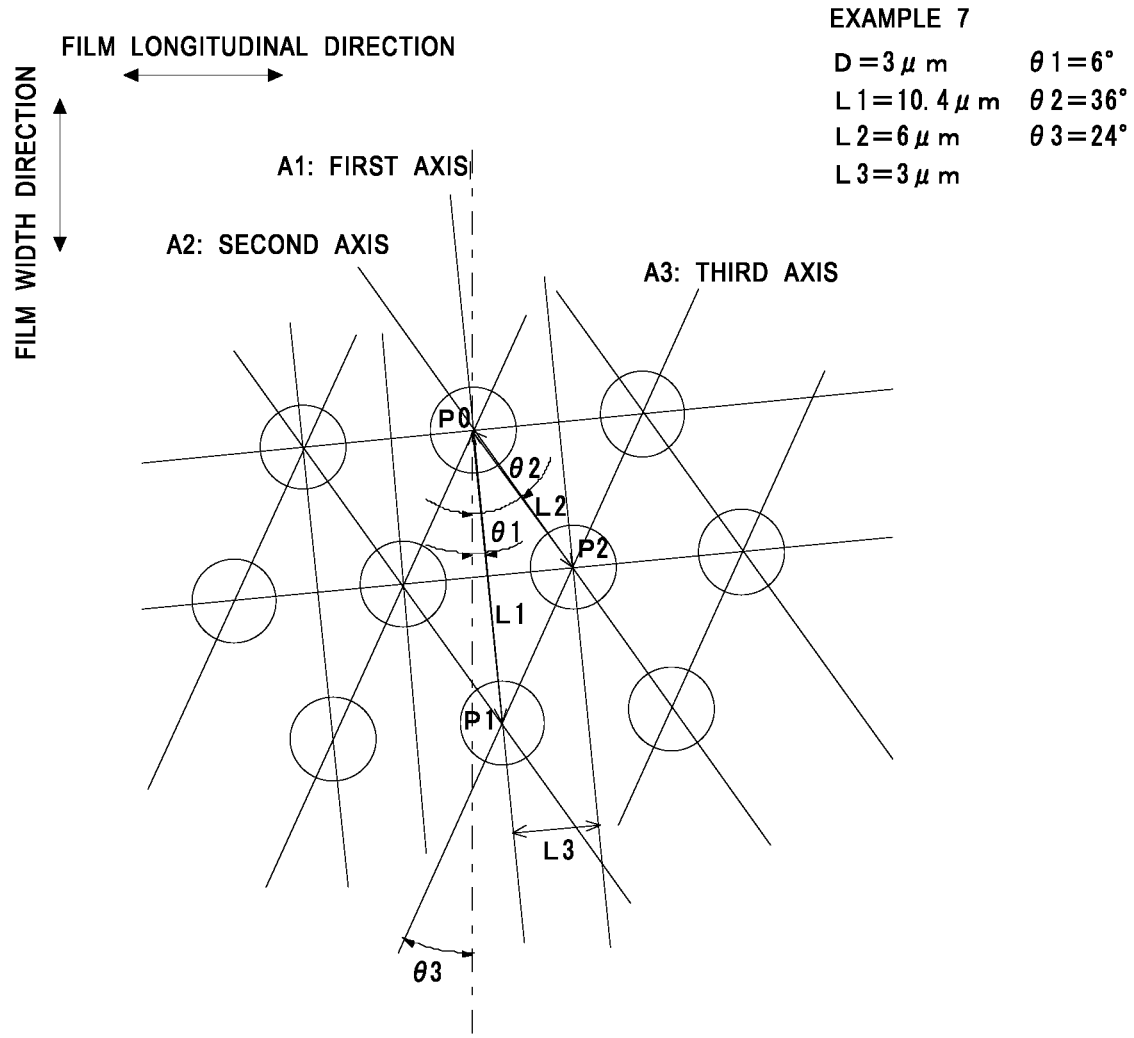
FIG. 10 is a diagram illustrating disposition of electrically conductive particles in an anisotropic electrically conductive film of an example.

|  | Example 3 | Example 4 | Example 5 | Example 6 | Example 7 |
|---|---|---|---|---|---|
| Electrically conductive particles | | | | | |
| Particle shape | Spherical | Spherical | Spherical | Spherical | Spherical |
| Electrically conductive particle diameter (μm) | 3 | 3 | 3 | 3 | 3 |
| Number density (per mm$^2$) | 22500 | 32000 | 16000 | 16000 | 32000 |
| Arrangement | | | | | |
| Arrangement pattern | FIG. 6 | FIG. 7 | FIG. 8 | FIG. 9 | FIG. 10 |
| Angle θ1(°) formed by first axes with film width | 15 | 6 | 1.1 | 15 | 6 |
| Angle θ2(°) formed by second axes with film width | 53 | 54 | 76 | 64 | 36 |
| Angle θ3(°) formed by third axes with film width | 83 | 66 | 27 | 34 | 24 |
| Electrically conductive particle pitch L1 of first axes (μm) | 6 | 6 | 10.4 | 10.4 | 10.4 |
| Minimum interparticle spacing L2 between adjacent first axes (μm) | 8 | 6 | 6 | 7.9 | 6 |
| Axis pitch of first axes (L3) (μm) | 7.4 | 5.2 | 5.7 | 6 | 3 |
| Evaluation | | | | | |
| Connected object for evaluation (wire width: 15 μm; wire length: 100 μm) | COG | COG | COG | COG | COG |
| Initial electrical conduction resistance (Ω) | 0.2 | 0.2 | 0.2 | 0.2 | 0.2 |
| Conduction reliability (Ω) | 2.3 | 2.2 | 2.2 | 2.3 | 2.2 |
| Indentation (proportion of particles having a crushing percentage of 120% or greater) (%) | 90≤ | 90≤ | 90≤ | 90≤ | 90≤ |
| Particle capturing capability (effective bump width: 15 μm) | A | A | A | A | A |
| Particle capturing capability (effective bump width: 5 μm) | C | B | C | C | B |
| Short-circuit occurrence rate | <50 ppm | <50 ppm | <50 ppm | <50 ppm | <50 ppm |

From Table 2, it is seen that Comparative Example 2, in which the first axes of the arrangements of the electrically conductive particles were parallel to the film width direction, exhibited low electrically conductive particle capturing capability, whereas anisotropic electrically conductive films of Examples were evaluated as good for all categories. Table 2 indicates that Comparative Examples 2 and 3 scored C in evaluations of the number of captured particles in the case of the 5 μm effective bump width. Score C was an evaluation of being suitable for practical use. However, there was a tendency that, as the sample number increased, the tendency toward D increased (in other results, there were no particular changes in tendencies). For this reason, although the scores of Comparative Examples 2 and 3 were C, they were listed as Comparative Examples. The increased tendency toward D score with the increase of the sample number in Comparative Examples 2 and 3 may be attributable to a slight misalignment that occurred in the bonding of the film. That is, it is believed that, when the rows of the electrically conductive particles are all inclined with respect to the longitudinal direction and short-side (width) direction of the film, it is easier to obtain anisotropically electrically conductive connection structures that can provide stable performance. Furthermore, in Examples, even when the number density of the electrically conductive particles was 16000 per mm², the conduction characteristics and the particle capturing capability were good, whereas, in Comparative Examples, the number density of the same number resulted in unacceptable capturing capability when the effective bump width was reduced to 5 μm.

Examples 8 to 10

To investigate the influence of the arrangements of the electrically conductive particles on the conduction characteristics, anisotropic electrically conductive films for FOG of Examples 8 to 10 were produced in the same manner as in Example 1 except that the arrangements of the electrically conductive particles were varied as shown in Table 3.

In this case, the connected objects for evaluation used were the following evaluation flexible printed circuit substrate and glass substrate, which were connected together with an effective mounting area of 100% or 80% (180° C., 80 MPa, 5 seconds).

Herein, the connected objects for evaluation having an effective mounting area of 100% refers to objects having no misalignment between the flexible printed circuit substrate and the glass substrate or having a misalignment range of not greater than 2%, and those of 80% refers to objects having a misalignment range of 20%.

Flexible printed circuit substrate for evaluation (FPC)
S/R PI system, PI 38 μmt-S'perflex base
Wire length: 2 mm (tool used: 1 mm in width)
Wire width: 200 μm
Mounting area per terminal: 0.2 mm²
Wire spacing: 200 μm
Bump height: 8 μm (Cu 8 μmt-Sn plating)
Glass substrate: Manufactured by Corning Inc.
Dimensions: 30×50 mm
Thickness: 0.5 mm
Terminal: ITO wiring As with Example 1, (a) initial conduction resistance and (b) indentation of the obtained connected objects for evaluation were evaluated, and as with Example 2, (d) conduction reliability and (e) short-circuit occurrence rate were evaluated. In connected evaluation objects having an effective mounting area of 100%, the numbers of captured electrically conductive particles on 100 bumps were measured and the average number of captured particles (number of captured electrically conductive particles Ave) per bump was determined.

The results are shown in Table 3.

TABLE 3

|  | Example 8 | Example 9 | Example 10 |
|---|---|---|---|
| Electrically conductive particles | | | |
| Particle shape | Spherical | Spherical | Spherical |
| Electrically conductive particle diameter (μm) | 3 | 3 | 3 |
| Number density (per mm²) | 59 | 230 | 102 |
| Arrangement | | | |
| Arrangement pattern | FIG. 11 | FIG. 12 | FIG. 13 |
| Angle θ1(°) formed by first axes with film width | 16 | 44 | 44 |
| Angle θ2(°) formed by second axes with film width | 44 | (46) | (46) |
| Angle θ3(°) formed by third axes with film width | 76 | (59) | (75) |
| Electrically conductive particle pitch L1 of first axes (μm) | 140 | 31 | 70 |
| Minimum interparticle spacing L2 between adjacent first axes (μm) | 140 | 140 | 140 |
| Axis pitch of first axes (L3) (μm) | 121 | 140 | 140 |
| Evaluation | | | |
| Connected object for evaluation (wire width: 200 μm, wire length: 2 mm) | FOG | FOG | FOG |
| Effective mounting area (%) | 100　　80 | 100　　80 | 100　　80 |
| Initial electrical conduction resistance (Ω) | 1.2　　1.4 | 1.2　　1.3 | 1.2　　1.3 |
| Conduction reliability (Ω) | 2.6　　3.2 | 2.2　　2.8 | 2.4　　2.9 |
| Indentation (proportion of particles having a crushing percentage of 120% or greater) (%) | 90≤　　90≤ | 90≤　　90≤ | 90≤　　90≤ |
| Number of captured particles (Ave.) | 10.6　　8.7 | 44.5　　35.2 | 19.6　　15.4 |
| Short-circuit occurrence rate | <50 ppm | <50 ppm | <50 ppm |

Next, the FPC and the tool width were changed to the ones described below, and connections were made using the anisotropic electrically conductive films of Examples 8, 9, and 10 for evaluation. Results are shown in Table 4.

Evaluation flexible printed circuit substrate (FPC) S/R PI system, PI 38 μmt-S'perflex base
Wire length: 2 mm (tool used: 2 mm in width)
Wire width: 36 μm
Mounting area per terminal: 0.072 mm²
Wire spacing: 200 μm
Bump height: 8 μm (Cu 8 μmt-Sn plating)

TABLE 4

|  | Example 8 | | Example 9 | | Example 10 | |
|---|---|---|---|---|---|---|
| Evaluation | | | | | | |
| Connected object for evaluation (wire width: 36 μm, wire length: 2 mm) | FOG | | FOG | | FOG | |
| Effective mounting area (%) | 100 | 80 | 100 | 80 | 100 | 80 |
| Initial electrical conduction resistance (Ω) | 1.4 | 1.5 | 1.2 | 1.2 | 1.3 | 1.4 |
| Conduction reliability (Ω) | 3.8 | 4.5 | 2.2 | 2.4 | 3.3 | 3.6 |
| Indentation (proportion of particles having a crushing percentage of 120% or greater) (%) | 90≤ | 90≤ | 90≤ | 90≤ | 90≤ | 90≤ |
| Number of captured particles (Ave.) | 4.1 | 3.1 | 15.9 | 12.4 | 7.1 | 5.4 |
| Short-circuit occurrence rate | <50 ppm | | <50 ppm | | <50 ppm | |

Tables 3 and 4 demonstrate that, in the case of FOG, when the number of captured electrically conductive particles per terminal is greater than or equal to 3, sufficient conduction characteristics are provided.

REFERENCE SIGNS LIST 1, 1A, 1B, 1C, 1D, 1E, 1F, 1G Anisotropic electrically conductive film
2 Electrically insulating adhesive layer
3 Terminal
A1 First axis
A2 Second axis
A3 Third axis
D Electrically conductive particle diameter
L1 Electrically conductive particle pitch
L2 Minimum interparticle spacing between adjacent first axes
L3 Axis pitch
Lp Terminal pitch
Lq Terminal width
Lr Terminal length
P Electrically conductive particle

The invention claimed is:

1. An anisotropic electrically conductive film comprising: an electrically insulating adhesive layer; and
electrically conductive particles disposed in the electrically insulating adhesive layer, wherein:
the electrically conductive particles are arranged such that first axes, along which the electrically conductive particles are arranged at a predetermined particle pitch, are arranged side by side at a predetermined axis pitch,
the electrically conductive particles are substantially spherical,
directions of all sides of a triangle formed by an electrically conductive particle P0, an electrically conductive particle P1, and an electrically conductive particle P2 are oblique to a film width direction of the anisotropic electrically conductive film, the electrically conductive particle P0 being any one of the electrically conductive particles at any one of the first axes, the electrically conductive particle P1 being at the one of the first axes and adjacent to the electrically conductive particle P0, the electrically conductive particle P2 being at another one of the first axes that is adjacent to the one of the first axes, and the electrically conductive particle P2 being spaced from the electrically conductive particle P0 by a minimum spacing, and
the number density of the electrically conductive particles ranges from 40 to 100000 per mm².

2. The anisotropic electrically conductive film according to claim 1, wherein the number density of the electrically conductive particles ranges from 500 to 3000 per mm².

3. The anisotropic electrically conductive film according to claim 1, wherein, on the electrically insulating adhesive layer, another electrically insulating adhesive layer is furthermore formed.

4. The anisotropic electrically conductive film according to claim 1, wherein two or more kinds of the electrically conductive particles are used.

5. The anisotropic electrically conductive film according to claim 1, wherein the electrically conductive particles have a sphericity ranging from 70 to 100, the sphericity being calculated by the equation:

$$\text{Sphericity} = \{1-(So-Si)/So\} \times 100$$

where So is an area of a circumscribed circle of an electrically conductive particle in a plane image of the electrically conductive particles, and Si is an area of an inscribed circle of the electrically conductive particle in the plane image of the electrically conductive particles.

6. The anisotropic electrically conductive film according to claim 1, wherein a film length of the anisotropic electrically conductive film is greater than or equal to 5000 times a film width of the anisotropic electrically conductive film.

7. The anisotropic electrically conductive film according to claim 1, wherein the electrically conductive particles are arranged in the directions of all the sides of the triangle.

8. The anisotropic electrically conductive film according to claim 1, wherein the first axes are arrangement axes having a minimum particle pitch.

9. The anisotropic electrically conductive film according to claim 1, wherein, provided that the electrically conductive particles are arranged in the directions of all the sides of the triangle and the first axes, second axes, and third axes are defined as lattice axes formed by extensions of the sides, a particle pitch along at least one lattice axis includes wide and narrow pitches that repeat in a regular manner.

10. The anisotropic electrically conductive film according to claim 1, wherein, provided that the electrically conductive particles are arranged in the directions of all the sides of the triangle and the first axes, second axes, and third axes are defined as lattice axes form by extensions of the sides, an axis pitch of at least one lattice axis includes wide and narrow pitches that occur in a regular manner.

11. The anisotropic electrically conductive film according to claim 1, wherein, provided that the electrically conductive particles are arranged in the directions of all the sides of the triangle and the first axes, second axes, and third axes are defined as lattice axes formed by extensions of the sides, the anisotropic electrically conductive film includes fourth axes that are lattice axes extending in a same direction as the first axes, the second axes, or the third axes, the fourth axes including arrangements of electrically conductive particles corresponding to the arrangements of the first axes, the second axes, or the third axes except that some electrically conductive particles among the electrically conductive particles are missing in a regular manner, the first axes, the second axes, or the third axes being in the same direction as the fourth axes.

12. The anisotropic electrically conductive film according to claim 1, wherein the first axes are offset within a bandwidth sufficiently small relative to the axis pitch L3.

13. The anisotropic electrically conductive film according to claim 1, wherein the first axes are offset within a bandwidth that is less than 0.5 times the average particle diameter of the electrically conductive particles.

14. The anisotropic electrically conductive film according to claim 1, wherein the electrically insulating adhesive layer is polymerized upon anisotropic conductive connection.

15. The anisotropic electrically conductive film according to claim 1, wherein the minimum spacing L2 is different from the predetermined particle pitch L1.

16. A connection structure comprising:
   the anisotropic electrically conductive film according to claim 1;
   a first electric component; and
   a second electric component, wherein
   an anisotropically electrically conductive connection being formed between the first electronic component and the second electronic component using the anisotropic electrically conductive film.

17. A method for manufacturing a connection structure comprising forming an anisotropically electrically conductive connection between a first electronic component and a second electronic component via the anisotropic electrically conductive film according to claim 1.

* * * * *